(12) United States Patent
Cho

(10) Patent No.: US 11,632,890 B2
(45) Date of Patent: Apr. 18, 2023

(54) DISPLAY DEVICE

(71) Applicant: LG Display Co., Ltd., Seoul (KR)

(72) Inventor: SeokHyo Cho, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 173 days.

(21) Appl. No.: 16/932,408

(22) Filed: Jul. 17, 2020

(65) Prior Publication Data

US 2021/0167154 A1 Jun. 3, 2021

(30) Foreign Application Priority Data

Nov. 28, 2019 (KR) ........................ 10-2019-0155325

(51) Int. Cl.
*H10K 59/128* (2023.01)
*H10K 59/38* (2023.01)

(52) U.S. Cl.
CPC ........... *H10K 59/128* (2023.02); *H10K 59/38* (2023.02)

(58) Field of Classification Search
None
See application file for complete search history.

(56) References Cited

U.S. PATENT DOCUMENTS

| | | | | |
|---|---|---|---|---|
| 2010/0298032 A1* | 11/2010 | Lee | ........................ | G06F 1/1616 345/173 |
| 2015/0212546 A1* | 7/2015 | Ram | ..................... | G06F 1/1654 361/679.01 |
| 2015/0220299 A1* | 8/2015 | Kim | ....................... | G06F 1/1635 345/1.3 |
| 2015/0355729 A1* | 12/2015 | Park | ..................... | G06F 1/1686 345/173 |
| 2015/0378393 A1* | 12/2015 | Erad | ..................... | G06F 3/1446 345/1.3 |
| 2016/0350057 A1* | 12/2016 | Kwon | ................. | G06F 3/04886 |
| 2018/0090063 A1* | 3/2018 | Ying | ..................... | G09G 3/3225 |

FOREIGN PATENT DOCUMENTS

KR 10-1718241 B1 3/2017
KR 10-2019-0010298 A 1/2019

* cited by examiner

*Primary Examiner* — Khaja Ahmad
(74) *Attorney, Agent, or Firm* — Polsinelli PC

(57) ABSTRACT

A display device includes a second transparent display panel overlapping the first transparent display panel and including a plurality of pixels. The display device further includes an elastic member pressing one side of the second transparent display panel. The display device further includes an adjustment member at the other side of the second transparent display panel and moving the second transparent display panel to left side or right side. Therefore, there is provided a display device capable of both of a transparent double-sided display and a general double-sided display.

21 Claims, 17 Drawing Sheets

DISPLAY DEVICE

CROSS-REFERENCE TO RELATED APPLICATION

This application claims the priority benefit of Korean Patent Application No. 10-2019-0155325 filed on Nov. 28, 2019, which is hereby incorporated by reference in its entirety.

BACKGROUND

Field of the Disclosure

The present disclosure relates to a display device, and more particularly, to a display device capable of double-sided display and transparent double-sided display.

Description of the Background

Recently, as society advances toward an information-oriented society, the field of display devices for visually expressing electrical information signals has rapidly advanced. Various display devices, having excellent performance in terms of thinness, lightness, and low power consumption, are being developed correspondingly. Specific examples of such a display device include an electroluminescence display, such as a liquid crystal display (LCD), an organic light emitting display (OLED), and a quantum dot light emitting display (QLED), and the like.

In addition, the development of double-sided light emitting display devices, transparent light emitting display devices, and the like, have advanced in recent years. In such a double-sided light emitting display device, an image is displayed on both a front surface and a rear surface of the display device, so that a user may view the image on either the front or rear surface. The transparent light emitting display device has transparency, so that a user may recognize an object at the rear of the transparent light emitting display device. Accordingly, continuous development is being conducted to improve user convenience and realize a new experience through double-sided light emitting display devices or transparent light emitting display devices.

SUMMARY

Accordingly, the present disclosure is to provide a display device capable of a transparent double-sided display or a general double-sided display through a first transparent display panel and a second transparent display panel including a transmission area and an emission area.

In addition, the present disclosure is to provide a display device capable of switching a transparent double-sided display or a general double-sided display through a simple structure and a simple operation.

The present disclosure is not limited to the above-mentioned objects, and other objects, which are not mentioned above, can be clearly understood by those skilled in the art from the following descriptions.

According to an aspect of the present disclosure, there is provided a display device. The display device includes a first transparent display panel including a plurality of pixels. The display device further includes a second transparent display panel overlapping the first transparent display panel and including a plurality of pixels. The display device further includes an elastic member pressing one side of the second transparent display panel. The display device further includes an adjustment member at the other side of the second transparent display panel and moving the second transparent display panel to left side or right side.

According to another aspect of the present disclosure, there is provided a display device. The display device includes a first transparent display panel including a plurality of pixels. The display device further includes a second transparent display panel overlapping the first transparent display panel and including a plurality of pixels. The display device further includes an elastic member pressing one side of the second transparent display panel. The display device further includes an adjustment member at the other side of the second transparent display panel and moving the second transparent display panel to left side or right side. The display device further includes a first case and a second case surrounding one sides and the other sides of the first transparent display panel and the second transparent display panel, respectively. Each of the plurality of pixels includes a transmission area and an emission area, the transmission area being disposed left side and the emission area being disposed right side in a first direction in which the second transparent display panel moves. By the movement of the second transparent display panel, the transmission area of the first transparent display panel overlaps the transmission area or the emission area of the second transparent display panel.

Other detailed matters of the exemplary aspects are included in the detailed description and the drawings.

According to an aspect of the present disclosure, two display modes of a transparent double-sided display and a general double-sided display may be implemented by changing a structure in which transmission areas and emission areas of a first transparent display panel and a second transparent display panel overlap each other, depending on a situation.

According to another aspect of the present disclosure, a structure and switch of a transparent double-sided display mode or a general double-sided display mode of the display device may be simply performed.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
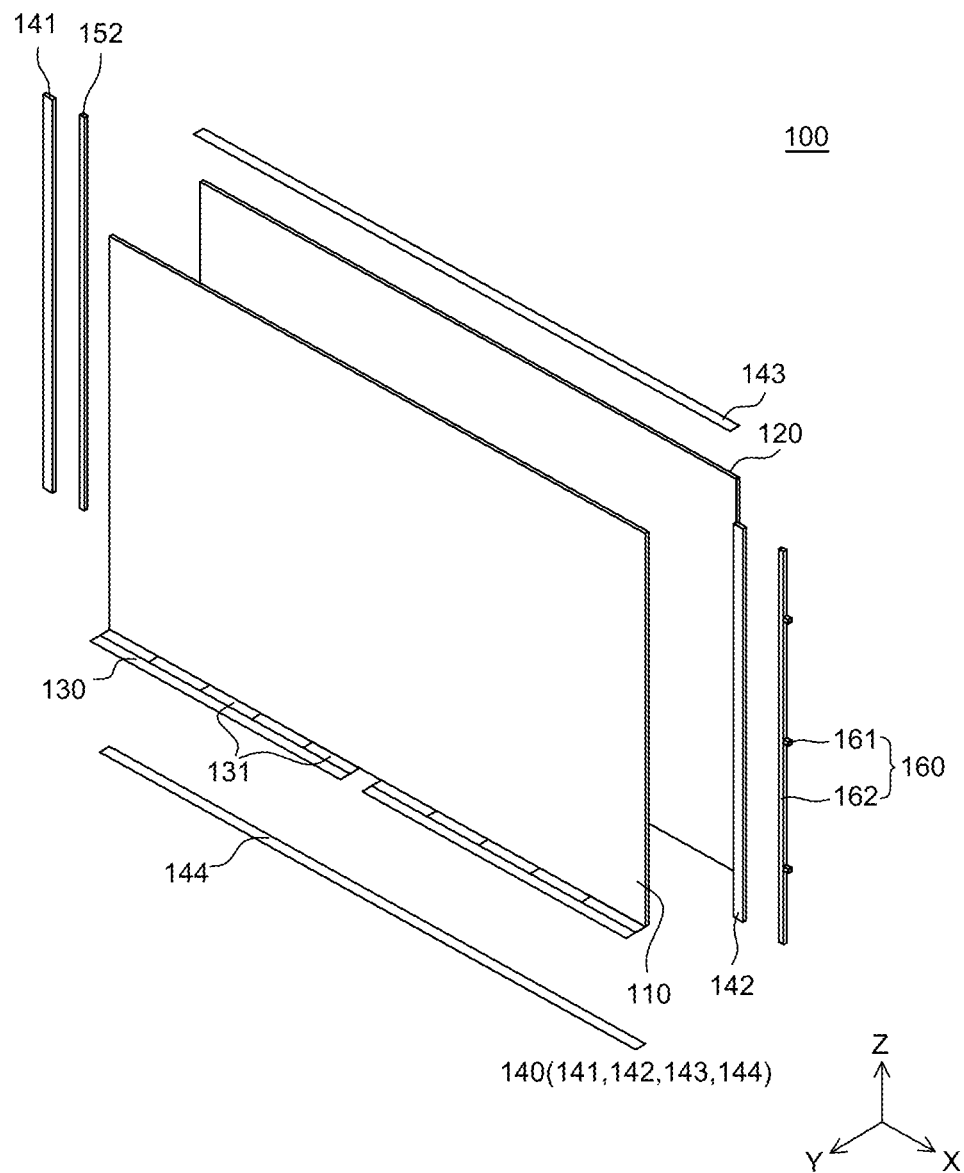
FIG. 1 is an exploded perspective view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, the present disclosure will be described in detail with reference to accompanying drawings.

Figure 2A:
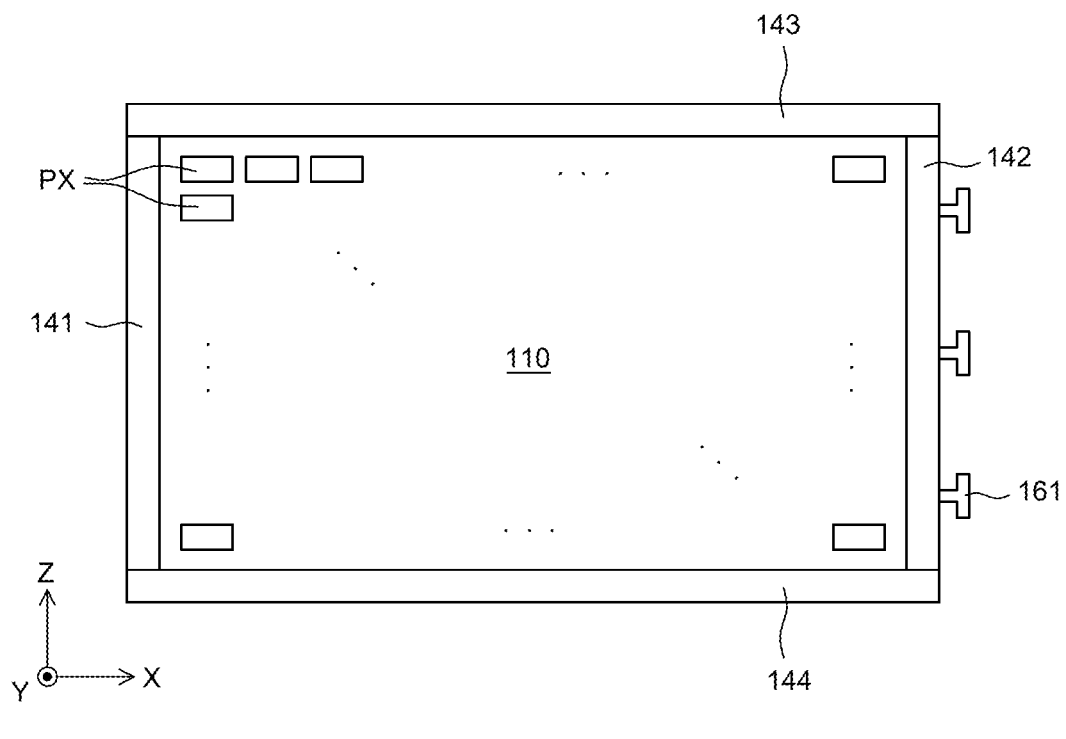
FIGS. 2A to 2C are plan views of the display device according to an exemplary aspect of the present disclosure.
Figure 2B:
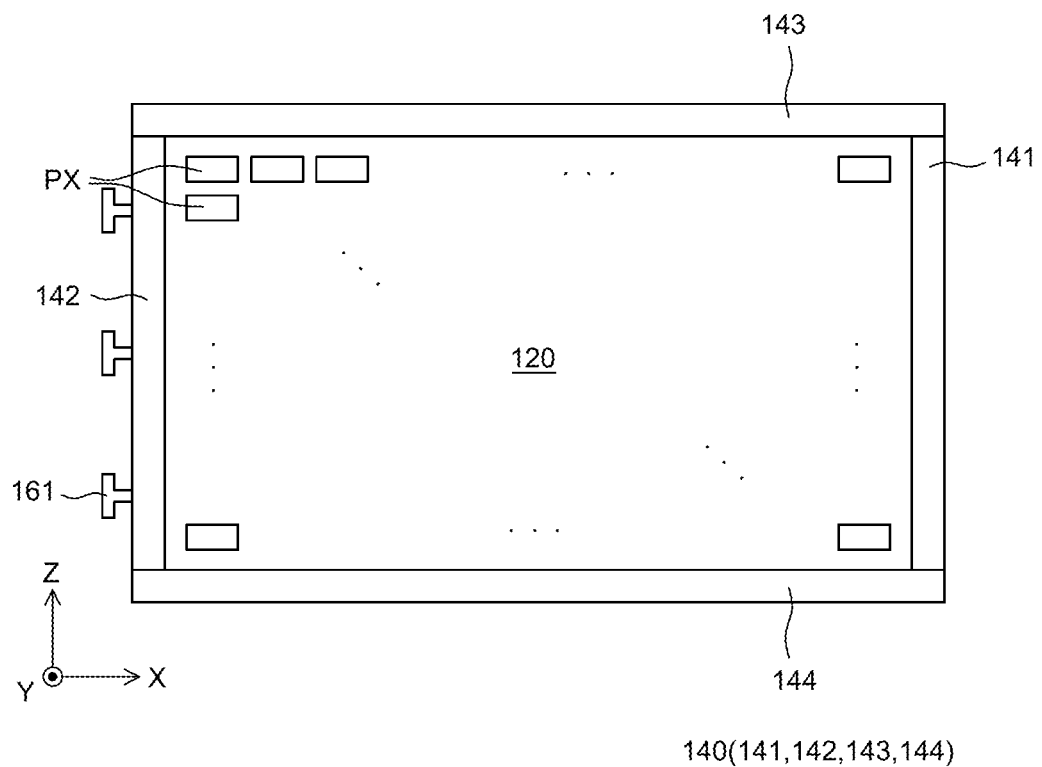
Figure 2C:
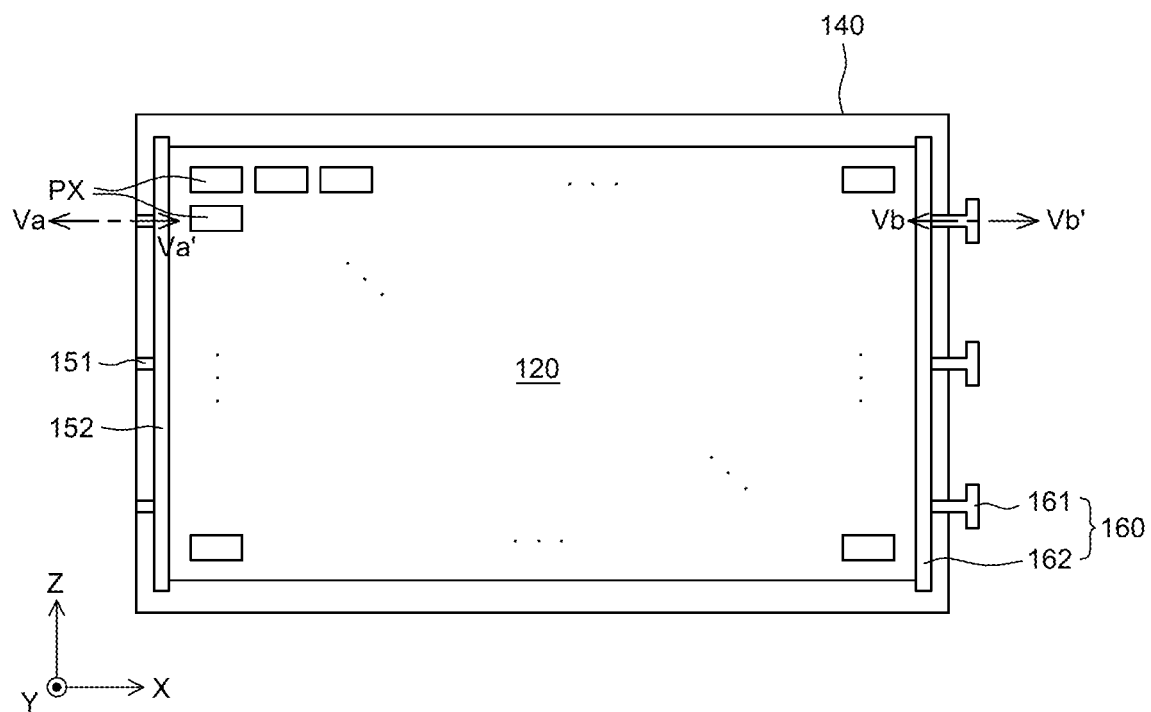
Figure 3A:
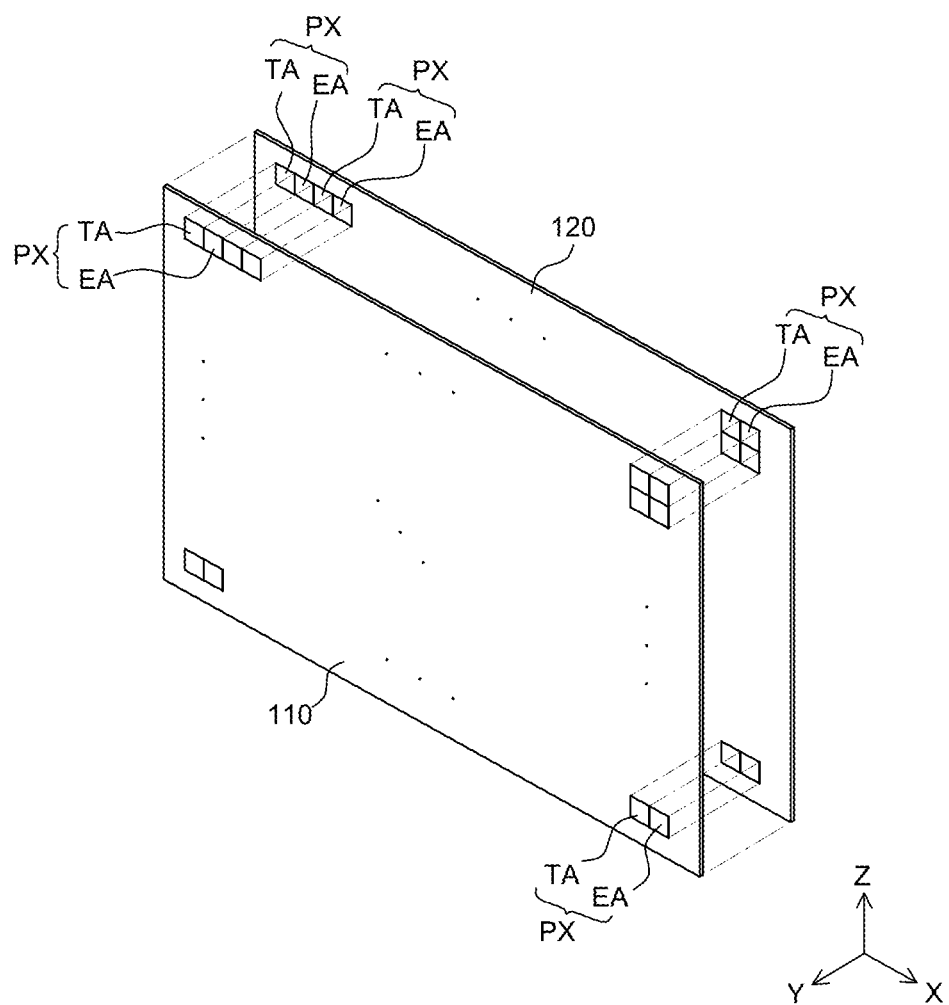
FIGS. 3A and 3B are perspective views for explaining a principle of switching between a first display mode and a second display mode of the display device according to an exemplary aspect of the present disclosure.
Figure 3B:
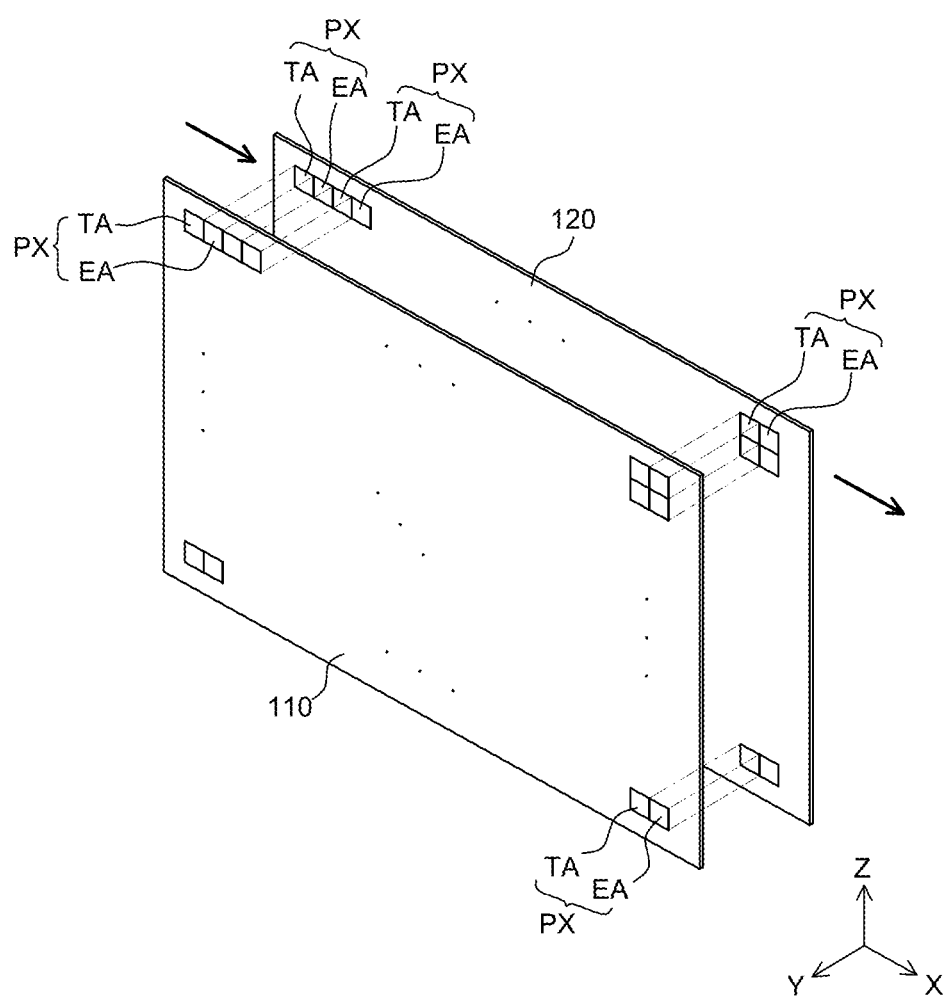

FIG. 1 is an exploded perspective view of a display device according to an exemplary aspect of the present disclosure. FIGS. 2A to 2C are plan views of the display device according to an exemplary aspect of the present disclosure. FIGS. 3A and 3B are perspective views for explaining a principle of switching between a first display mode and a second display mode of the display device according to an exemplary aspect of the present disclosure. FIG. 2A is a plan view of a display device 100 when viewed from a front of a first transparent display panel 110. FIG. 2B is a plan view of the display device 100 when viewed from a front of a second transparent display panel 120. FIG. 2C is a plan view of the display device 100 illustrating a coupling relationship of the second transparent display panel 120 within a case 140. FIG. 3A illustrates an arrangement structure of a first transparent display panel 110 and a second transparent display panel 120 in a first display mode of the display device 100. FIG. 3B illustrates an arrangement structure of the first transparent display panel 110 and the second transparent display panel 120 in a second display mode of the display device 100.

With reference to FIGS. 1 to 3B, the display device 100 includes the first transparent display panel 110, the second transparent display panel 120, a printed circuit board 130, the case 140, and an elastic member 151, an adjustment liner 152 and an adjustment member 160.

The display device 100 may be a transparent double-sided light emitting display device. That is, the display device 100 emits light to two surfaces thereof and may have transparency. Specifically, the display device 100 may display an image such as a video, a static image, a still cut or the like on two surfaces thereof by emitting light through an emission area EA of FIG. 4 to be described later. In this case, the display device 100 may display the same image on two surfaces thereof. Also, the display device 100 may have transparency by transmitting light incident from the outside through a transmission area TA. Accordingly, a user may view an image on front and rear surfaces of the display device 100 and at the same time, recognize an object on the opposite side of the display device 100. Here, the front surface may mean a surface on which the first transparent display panel 110 of FIG. 1 is located, and the rear surface may mean a surface on which the second transparent display panel 120 of FIG. 1 is located. However, aspects of the present disclosure are not limited thereto, and the surface on which the second transparent display panel 120 is located may be the front surface, and the surface on which the first transparent display panel 110 is located may be the rear surface.

Meanwhile, the display device 100 may have the first display mode and the second display mode corresponding to FIGS. 3A and 3B, respectively. In this case, the first display mode is a transparent double-sided light emitting mode, in which an image is displayed on the two surfaces of the display device 100 and at the same time, transparency may be implemented. That is, in the first display mode, a user may view an image on the front and rear surfaces of the display device 100 and recognize an object on the opposite side of the display device 100. The second display mode is a general double-sided light emitting mode, in which transparency is not implemented and an image may be displayed on the two surfaces of the display device 100. That is, in the second display mode, a user cannot recognize an object on the opposite side of the display device 100, and can only view an image on the front and rear surfaces of the display device 100. The first display mode and the second display mode of the display device 100 will be described in detail later with reference to FIGS. 8A and 8B.

With reference to FIG. 1, the first transparent display panel 110 forms a screen of the front surface of the display device 100. That is, the first transparent display panel 110 may display an image of the front surface of the display device 100. An area of the first transparent display panel 110, where the image is displayed, may be disposed in an outer direction of the display device 100.

The second transparent display panel 120 forms a screen of the rear surface opposite to the front surface of the display device 100. That is, the second transparent display panel 120 may display an image of the rear surface of the display device 100. An area of the second transparent display panel 120, where the image is displayed, may be disposed in the outer direction of the display device 100.

The second transparent display panel 120 may move to one side or the other side by interaction of the elastic member 151 and the adjustment member 160. Hereinafter, one side may mean left side in a first direction, which is an X-axis direction of FIG. 1, and the other side may mean right side in the first direction in FIG. 1. The display device 100 may be switched to the first display mode or the second display mode by the movement of the second transparent display panel 120. This will be described later with reference to FIGS. 6A to 8B.

The first transparent display panel 110 and the second transparent display panel 120 may overlap each other. Specifically, the first transparent display panel 110 and the second transparent display panel 120 may overlap each other in a second direction, which is a Y-axis direction in FIG. 1. In this case, surfaces of the first transparent display panel 110 and the second transparent display panel 120 that overlap each other may be opposite to the surfaces on which an image is displayed. Accordingly, the first transparent display panel 110 and the second transparent display panel 120 may display the front image and the rear image of the display device 100, respectively, so that a double-sided light emission of the display device 100 may be performed.

Each of the first transparent display panel 110 and the second transparent display panel 120 may include a transparent display area and a non-display area. Here, the transparent display area is an area where an image is practically displayed on the first transparent display panel 110 and the second transparent display panel 120, and may be exposed by the case 140. The non-display area is an area where an image is not displayed on the first transparent display panel 110 and the second transparent display panel 120, and may overlap the case 140 and not be exposed outwardly.

The transparent display area is disposed in the centers of the first transparent display panel 110 and the second transparent display panel 120, and may be an area where an image is displayed in the display device 100. A plurality of pixels PX may be included in the transparent display area. The pixel PX is a minimum unit constituting a screen, and each of the plurality of pixels PX may include a light emitting element 430 and a driving element of FIG. 5 to be described later. In addition, various driving elements such as transistors, capacitors, and lines for driving the light emitting element 430 may be disposed in the transparent display area. In this case, the driving elements may include a switching transistor, a driving transistor, and the like. The driving elements may be electrically connected to a signal line such as a gate line and a data line connected to a gate driver, a data driver, and the like, disposed in the non-display area.

Meanwhile, FIGS. 2A to 2C illustrate the plurality of pixels PX as being spaced apart from each other, for convenience of illustration. However, the present disclosure is not limited thereto, and practically, the plurality of pixels PX may be disposed to contact each other as illustrated in FIGS. 3A and 3B.

With reference to FIGS. 3A and 3B, each of the plurality of pixels PX may include the transmission area TA and the emission area EA. The first transparent display panel 110 and the second transparent display panel 120 may have transparency by transmitting light through the transmission areas TA. In addition, the first transparent display panel 110 and the second transparent display panel 120 may display an image by emitting light through the emission areas EA. Accordingly, each of the first transparent display panel 110 and the second transparent display panel 120 may be implemented as a transparent light emitting display panel.

With reference to FIG. 3A, in the first display mode, the transmission area TA of the first transparent display panel 110 may overlap the transmission area TA of the second transparent display panel 120. Also, the emission area EA of the first transparent display panel 110 may overlap the emission area EA of the second transparent display panel 120. That is, the display device 100 may implement transparency by transmitting light through the transmission areas TA of the first transparent display panel 110 and the second transparent display panel 120 that overlap each other. Also, the display device 100 may emit light to the two surfaces thereof through the emission areas EA of the first transparent display panel 110 and the second transparent display panel 120 that overlap each other, thereby displaying an image on the two surfaces.

With reference to FIG. 3B, in the second display mode, the second transparent display panel 120 may move in a direction parallel to the first direction as illustrated by an arrow. Accordingly, the transmission area TA of the first transparent display panel 110 may overlap the emission area EA of the second transparent display panel 120. In addition, the emission area EA of the first transparent display panel 110 may overlap the transmission area TA of the second transparent display panel 120. That is, in the second display mode, the transmission areas TA and the emission areas EA of the first transparent display panel 110 and the second transparent display panel 120 may overlap each other. Accordingly, the transmission areas TA of the front surface of the display device 100 overlap the emission areas EA of the rear surface of the display device 100, and the transmission areas TA of the rear surface of the display device 100 overlap the emission areas EA of the front surface of the display device 100, so that transmission of light through the transmission areas TA may be prevented, and transparency may not be implemented. Therefore, in the second display mode, the display device 100 may emit light to the two surfaces thereof through the emission areas EA, thereby display an image on the surfaces.

An arrangement structure of the first transparent display panel 110 and the second transparent display panel 120 in the first display mode and the second display mode, and the principle of switching between the first display mode and the second display mode will be described in more detail with reference to FIGS. 6A to 8B.

The non-display area is disposed in circumferential areas of the first transparent display panel 110 and the second transparent display panel 120, and may be an area where an image is not displayed. The non-display area may be disposed to surround the transparent display area. Various components for driving the plurality of pixels PX disposed in the transparent display area may be disposed in the non-display area. For example, a driver IC that supplies a signal for driving the plurality of pixels PX, a driving circuit, a signal line, a flexible film and the like may be disposed in the non-display area. In this case, the driver IC may include a gate driver, a data driver, and the like.

With reference to FIG. 1, the printed circuit board (PCB) 130 may be connected to each of the first transparent display panel 110 and the second transparent display panel 120. Although FIG. 1 illustrates only the printed circuit board 130 connected to the first transparent display panel 110, in practice, another printed circuit board 130 may also be connected to the second transparent display panel 120. The printed circuit board 130 may supply various control signals to the driving elements of the first transparent display panel 110 and the second transparent display panel 120.

The printed circuit board 130 may be electrically connected to the first transparent display panel 110 and the second transparent display panel 120 through a connection member 131. The connection member 131 may be composed of a flexible flat cable, a flexible printed circuit, or the like, but is not limited thereto.

With reference to FIGS. 1 to 2C, the case 140 is coupled to edge portions of the first transparent display panel 110 and the second transparent display panel 120. The case 140 may include a first case 141, a second case 142, a third case 143, and a fourth case 144.

The first case 141 is coupled to one sides of the first transparent display panel 110 and the second transparent display panel 120. The first case 141 may be disposed to surround one side surfaces of the first transparent display panel 110 and the second transparent display panel 120.

The second case 142 is coupled to the other sides of the first transparent display panel 110 and the second transparent display panel 120. The second case 142 may be disposed to surround the other side surfaces of the first transparent display panel 110 and the second transparent display panel 120.

The third case 143 is coupled to top portions of the first transparent display panel 110 and the second transparent display panel 120. The third case 143 may be disposed to surround top surfaces of the first transparent display panel 110 and the second transparent display panel 120.

The fourth case 144 is coupled to bottom portions of the first transparent display panel 110 and the second transparent display panel 120. The fourth case 144 may be disposed to surround bottom surfaces of the first transparent display panel 110 and the second transparent display panel 120. Meanwhile, the printed circuit board 130 and the connection member 131 may be accommodated within the fourth case 144, but aspects are not limited thereto.

With reference to FIG. 2C, the elastic member 151 may be disposed between the case 140 and one side surface of the second transparent display panel 120. Specifically, the elastic member 151 may be disposed between an inner surface of the first case 141 and the adjustment liner 152. The elastic member 151 is composed of a member having elasticity, and may be disposed between the first case 141 and the adjustment liner 152 in a compressed state. Therefore, the elastic member 151 may press one side of the second transparent display panel 120 and the adjustment liner 152 by restoring force. For example, the elastic member 151 may be composed of a compression spring, but is not limited thereto. In addition, in FIG. 2C, three elastic members 151 are illustrated, but aspects are not limited thereto.

With reference to FIGS. 1 and 2C, the adjustment liner 152 is disposed between the elastic member 151 and the second transparent display panel 120. The adjustment liner 152 may move in one direction or the other direction by the elastic member 151 and the adjustment member 160. The adjustment liner 152 may transmit the force applied from the elastic member 151 to the second transparent display panel 120. Accordingly, the second transparent display panel 120 is moved by the movement of the adjustment liner 152, whereby the display device 100 may be switched to the first display mode or the second display mode. In FIGS. 1 and 2C, the adjustment liner 152 is singularly configured to correspond to the entirety of one side surface of the second transparent display panel 120, but aspects are not limited thereto. For example, the adjustment liner 152 may be provided in plural to correspond to the number of the elastic members 151.

With reference to FIGS. 1 to 2C, the adjustment member 160 is disposed on the other side of the second transparent display panel 120. Specifically, the adjustment member 160 may be disposed to correspond to the second case 142. The adjustment member 160 may include a main adjustment portion 161 and a push liner 162.

The main adjustment portion 161 may be coupled to the second case 142. In this case, a portion of the main adjustment portion 161 protrudes outwardly of the second case 142, and the other portion of the main adjustment portion 161 may be coupled to an inner portion of the second case 142. The main adjustment portion 161 may move the push liner 162 in one direction or the other direction. For example, the main adjustment portion 161 may be composed of a rotating bolt or a spring clamp, but is not limited thereto. When the main adjustment portion 161 is a rotating bolt, it may be rotated by a head portion disposed outside. When the main adjustment portion 161 is a spring clamp, the main adjustment portion 161 is moved by a spring operation, and a position of the main adjustment portion 161 may be fixed by the clamp. Hereinafter, for convenience of description, it is assumed that the main adjustment portion 161 is a rotating bolt.

When the main adjustment portion 161 moves in a direction away from the second transparent display panel 120 by the rotation, the push liner 162 may move in the other direction of the second case 142 by the restoring force of the elastic member 151. When the main adjustment portion 161 moves in a direction toward the second transparent display panel 120 by the rotation, the elastic member 151 is compressed, so that the push liner 162 moves in one direction of the second case 142. Meanwhile, in FIGS. 1 to 2C, three main adjustment portions 161 are illustrated, but aspects are not limited thereto. In addition, the main adjustment portion 161 may be disposed at a position corresponding to the elastic member 151 positioned on the opposite side thereof, based on the second transparent display panel 120, but aspects are not limited thereto.

The push liner 162 may be disposed between the main adjustment portion 161 and the second transparent display panel 120. The push liner 162 may move in one direction or the other direction by the main adjustment portion 161. The second transparent display panel 120 is moved by the movement of the push liner 162, whereby the display device 100 may be switched to the first display mode or the second display mode. In FIGS. 1 to 2C, the push liner 162 is singularly configured to correspond to the entirety of other side surface of the second transparent display panel 120, but aspects are not limited thereto. For example, the push liner 162 may be provided in plural to correspond to the number of the main adjustment portions 161.

Figure 4:
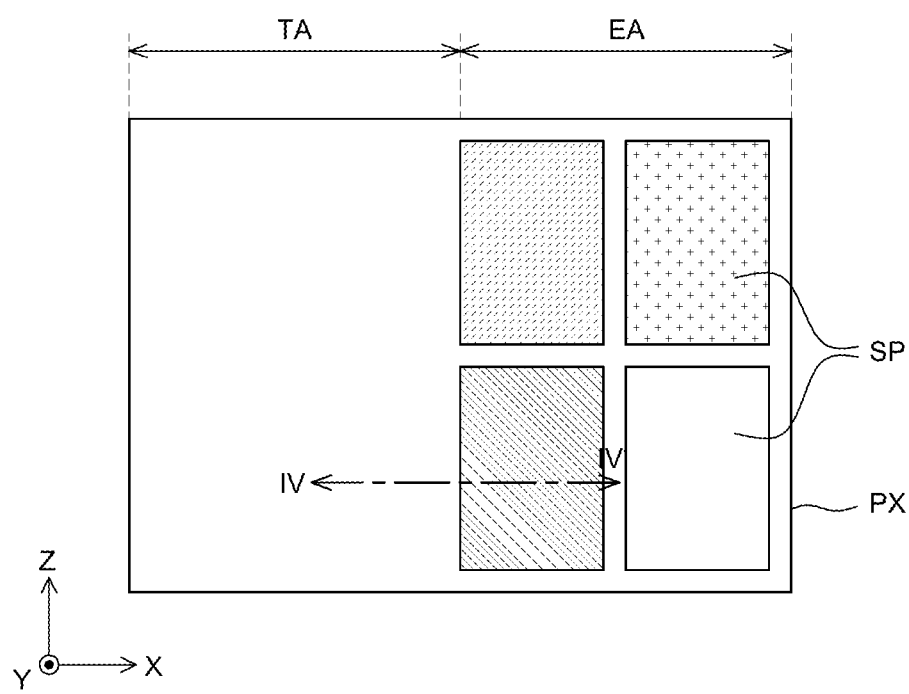
FIG. 4 is a schematic plan view of a pixel in the display device according to an exemplary aspect of the present disclosure.
Figure 5:
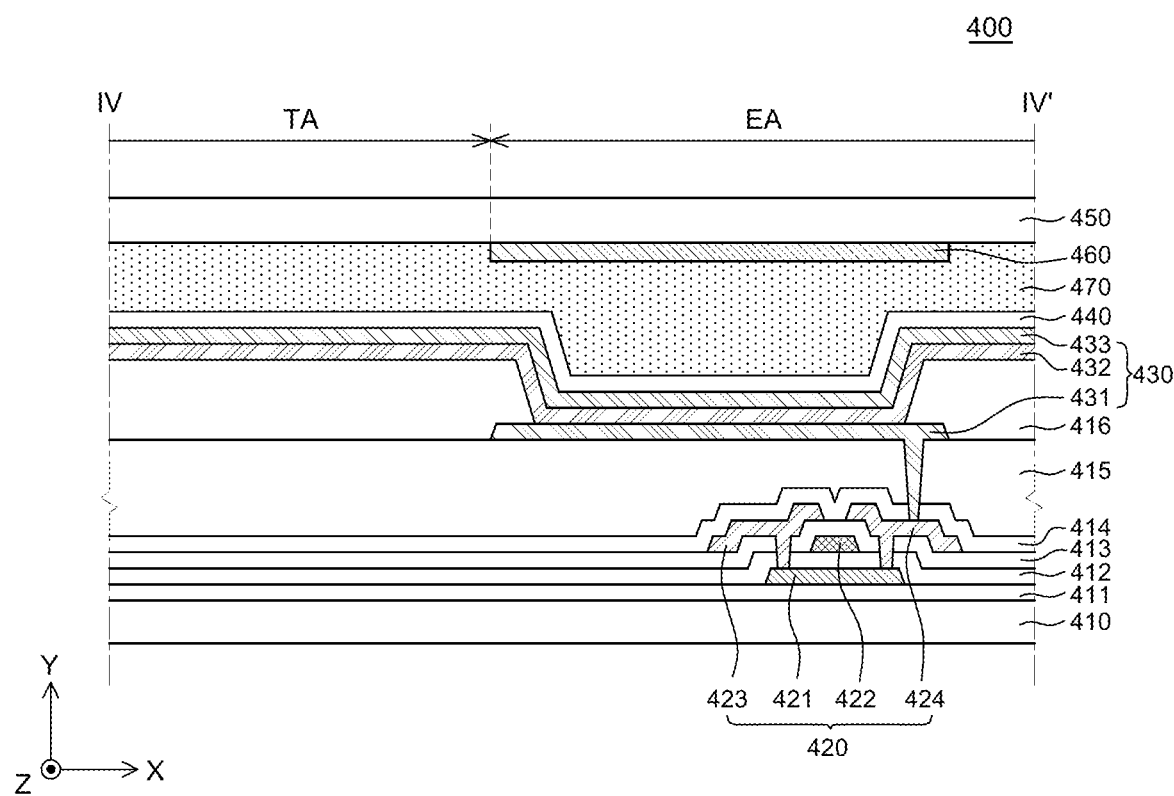
FIG. 5 is a cross-sectional view taken along line IV-IV' of FIG. 4.

FIG. 4 is a schematic plan view of a pixel in the display device according to an exemplary aspect of the present disclosure. FIG. 5 is a cross-sectional view taken along line IV-IV' of FIG. 4. A transparent display panel 400 of FIG. 5 may be the first transparent display panel 110 and the second transparent display panel 120 of FIG. 1.

First, with reference to FIG. 4, one pixel PX includes a transmission area TA and an emission area EA. The transmission area TA may be an area through which at least a portion of light incident from the outside is transmitted. The emission area EA may be an area through which light is emitted to implement an actual image. The transmission area TA and the emission area EA may be disposed left side and right side within the pixel PX, respectively, in the first direction. When the transmission area TA is disposed left side in the pixel PX, the emission area EA may be disposed right side in the pixel PX. Alternatively, when the emission area EA is disposed left side in the pixel PX, the transmission area TA may be disposed right side in the pixel PX.

The transmission area TA of the first transparent display panel 110 may overlap the transmission area TA or the emission area EA of the second transparent display panel 120 by the left side and right side movement of the second transparent display panel 120. Alternatively, the emission area EA of the first transparent display panel 110 may overlap the transmission area TA or the emission area EA of the second transparent display panel 120 by the left side and right side movement of the second transparent display panel 120.

Meanwhile, the transmission area TA and the emission area EA may be vertically disposed in a Z-axis direction. In this case, the second transparent display panel 120 may move in a vertical direction, rather than in a lateral direction. That is, by the movement of the second transparent display panel 120 in the vertical direction, the transmission area TA of the first transparent display panel 110 may overlap the transmission area TA or the emission area EA of the second transparent display panel 120, or the emission area EA of the first transparent display panel 110 may overlap the transmission area TA or the emission area EA of the second transparent display panel 120.

The display device 100 may be driven in the first display mode or the second display mode. In the first display mode, the first transparent display panel 110 and the second transparent display panel 120 may be disposed such that the transmission areas TA thereof overlap each other and the emission areas EA thereof overlap each other. Accordingly, in the first display mode, a user may simultaneously view an image of the emission area EA and a background through the transmission area TA. In the second display mode, the transmission area TA of any one of the first transparent display panel 110 and the second transparent display panel 120 may be disposed to overlap the emission area EA of the other panel. Accordingly, in the second display mode, the user may view only the image of the emission area EA. Meanwhile, in the first display mode and the second display mode, the first transparent display panel 110 and the second transparent display panel 120 may display the same image.

One pixel PX may include a plurality of sub-pixels SP. The plurality of sub pixels SP may be disposed in the emission area EA. The plurality of sub-pixels SP may include a red sub-pixel, a green sub-pixel, a blue sub-pixel, and a white sub-pixel, but is not limited thereto.

Hereinafter, a structure of the pixel PX of the transparent display panel 400 will be described in detail with reference to FIG. 5. With reference to FIG. 5, the transparent display panel 400 includes a first substrate 410, a transistor 420, a light emitting element 430, a second substrate 450, and a color filter 460.

The first substrate 410 is a substrate for supporting and protecting various components of the transparent display panel 400. The first substrate 410 may be formed of glass or plastic having ductility. The first substrate 410 may be disposed inside the display device 100. Specifically, the first transparent display panel 110 and the second transparent display panel 120 may be disposed such that the respective first substrates 410 thereof face each other.

A buffer layer 411 is disposed on the first substrate 410. The buffer layer 411 may improve adhesion between layers formed on the buffer layer 411 and the first substrate 410, and may block alkali components and the like, flowing out from the first substrate 410. The buffer layer 411 may be formed of a single layer of silicon nitride (SiNx) or silicon oxide (SiOx) or multiple layers of silicon nitride (SiNx) and silicon oxide (SiOx). The buffer layer 411 may be omitted. For example, the buffer layer 411 may be omitted based on a type and material of the first substrate 410 and a structure and type of the transistor 420.

The transistor 420 is disposed on the buffer layer 411 to drive the light emitting element 430. The transistor 420 includes an active layer 421, a gate electrode 422, a source electrode 423, and a drain electrode 424. The transistor 420 illustrated in FIG. 5 is a driving transistor, and is a thin film transistor having a top gate structure in which the gate electrode 422 is disposed on the active layer 421. However, aspects of the present disclosure are not limited thereto, and the transistor 420 may be implemented as a thin film transistor having a bottom gate structure.

The active layer 421 of the transistor 420 is disposed on the buffer layer 411. The active layer 421 is an area where a channel is formed when the transistor 420 is driven. The active layer 421 may be formed of an oxide semiconductor, or may be formed of amorphous silicon (a-Si), polycrystalline silicon (poly-Si), or an organic semiconductor.

A gate insulating layer 412 is disposed on the active layer 421. The gate insulating layer 412 may be formed of a single layer of silicon nitride (SiNx) or silicon oxide (SiOx) which is an organic material, or a multiple layer of silicon nitride (SiNx) or silicon oxide (SiOx). Contact holes are formed in the gate insulating layer 412 so that the source electrode 423 and the drain electrode 424 come into contact with a source region and a drain region of the active layer 421, respectively. The gate insulating layer 412 may be formed over the entire surface of the first substrate 410 as shown in FIG. 5, or may be patterned to have the same width as the gate electrode 422. However, aspects of the present disclosure are not limited thereto.

The gate electrode 422 is disposed on the gate insulating layer 412. The gate electrode 422 is disposed on the gate insulating layer 412 to overlap a channel region of the active layer 421. The gate electrode 422 may be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof.

An interlayer insulating layer 413 is disposed on the gate electrode 422. The interlayer insulating layer 413 may be formed of a single layer of silicon nitride (SiNx) or silicon oxide (SiOx) which is an inorganic material or a multiple layer of silicon nitride (SiNx) or silicon oxide (SiOx). Contact holes are formed in the interlayer insulating layer 413 so that the source electrode 423 and the drain electrode 424 come into contact with the source region and the drain region of the active layer 421, respectively.

The source electrode 423 and the drain electrode 424 are disposed on the interlayer insulating layer 413. The source electrode 423 and the drain electrode 424 are electrically connected to the active layer 421 through the contact holes of the gate insulating layer 412 and the interlayer insulating layer 413. The source electrode 423 and the drain electrode 424 may be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof.

In FIG. 5, for convenience of description, only a driving transistor among various types of transistor 420 included in the transparent display panel 400 is illustrated, but other transistors such as a switching transistor and the like may also be disposed therein.

With reference to FIG. 5, a passivation layer 414 for protecting the transistor 420 is disposed on the transistor 420. A contact hole for exposing the drain electrode 424 of the transistor 420 is formed in the passivation layer 414. In FIG. 5, a contact hole for exposing the drain electrode 424 is formed in the passivation layer 414, but a contact hole for exposing the source electrode 423 may also be formed. The passivation layer 414 may be formed of a single layer of silicon nitride (SiNx) or silicon oxide (SiOx) or a multiple layer of silicon nitride (SiNx) or silicon oxide (SiOx). However, the passivation layer 414 may be omitted depending on aspects.

An overcoating layer 415 for planarizing an upper portion of the transistor 420 is disposed on the passivation layer 414. The contact hole for exposing the drain electrode 424 of the transistor 420 is formed in the overcoating layer 415. FIG. 5 illustrates that the contact hole for exposing the drain electrode 424 is formed in the overcoating layer 415, but a contact hole for exposing the source electrode 423 may also be formed therein. The overcoating layer 415 may be formed of any one of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

With reference to FIG. 5, the light emitting element 430 is disposed on the overcoating layer 415. The light emitting element 430 includes a first electrode 431 formed on the overcoating layer 415 and electrically connected to the drain electrode 424 of the transistor 420, a light emitting layer 432 disposed on the first electrode 431, and a second electrode 433 formed on the light emitting layer 432. Here, the first electrode 431 may be an anode electrode, and the second electrode 433 may be a cathode electrode.

The first electrode 431 is disposed on the overcoating layer 415 and is electrically connected to the drain electrode 424 through the contact holes formed in the passivation layer 414 and the overcoating layer 415. The first electrode 431 may be formed of a conductive material having a high work function to supply holes to the light emitting layer 432. For example, the first electrode 431 may be formed of a transparent conductive oxide such as indium tin oxide (ITO), indium zinc oxide (IZO), indium tin zinc oxide (ITZO), zinc oxide (ZnO), and tin oxide (TO), but aspects are not limited thereto.

Meanwhile, when the transparent display panel 400 is a top emission type display panel, the light emitting element 430 is also configured as a top emission type light emitting element. The transparent display panel 400 according to an exemplary aspect of the present disclosure may be a top emission type display panel allowing for an image to be viewed from the front or rear surface of the display device 100. In the case of the top emission type, a reflective layer for reflecting light emitted from the light emitting layer 432 to the second electrode 433 may be disposed under the first electrode 431. The reflective layer may be formed of a material having excellent reflectivity, such as silver (Ag) or a silver alloy (Ag alloy), but is not limited thereto.

In FIG. 5, although the first electrode 431 is illustrated as being electrically connected to the drain electrode 424 of the transistor 420 through the contact hole, the first electrode 431 may be configured to be electrically connected to the source electrode 423 of the transistor 420 through the contact hole according to a type of the transistor 420, a design method of a driving circuit, and the like.

A bank 416 is disposed on the first electrode 431 and the overcoating layer 415. The bank 416 may cover a portion of the first electrode 431 of the light emitting element 430 to define a light emitting area. The bank 416 may be formed of an organic material. For example, the bank 416 may be formed of polyimide resin, acrylic resin, or benzocyclobutene resin, but is not limited thereto.

The light emitting layer 432 is disposed on the first electrode 431. The light emitting layer 432 may be a white light emitting layer. The light emitting layer 432 may further include various layers such as a hole transporting layer, a hole injection layer, a hole blocking layer, an electron injection layer, an electron blocking layer, and an electron transporting layer.

The second electrode 433 is disposed on the light emitting layer 432. The second electrode 433 supplies electrons to the light emitting layer 432. The second electrode 433 may be formed of a conductive material having a low work function. Since the transparent display panel 400 is a top emission type display panel, the second electrode 433 may have transparent or translucent characteristics such that light emitted from the light emitting layer 432 passes through the second electrode 433 to be emitted outwardly. For example, the second electrode 433 may be formed of a transparent conductive oxide such as indium tin oxide (ITO), indium zinc oxide (IZO), indium tin zinc oxide (ITZO), zinc oxide (ZnO), and tin oxide (TO) or an alloy of ytterbium (Yb), but is not limited thereto. Alternatively, the second electrode 433 may be formed of a very thin metal material. However, the second electrode 433 is not limited to the materials described above.

With reference to FIG. 5, an encapsulation layer 440 is disposed on the light emitting element 430. For example, the encapsulation layer 440 is disposed on the second electrode 433 to cover the light emitting element 430. The encapsulation layer 440 is disposed on the second electrode 433 to inhibit penetration of moisture or oxygen. The encapsulation layer 440 may be formed of an inorganic material such as silicon nitride (SiNx), silicon oxynitride (SiNxOy), or aluminum oxide (AlyOz), but is not limited thereto.

The second substrate 450 is disposed to face the first substrate 410. The second substrate 450 may be formed of glass or plastic having ductility. The second substrate 450 may be disposed on an outer portion of the display device 100. That is, the second substrate 450 of the first transparent display panel 110 corresponds to the front surface of the display device 100, and the second substrate 450 of the second transparent display panel 120 corresponds to the rear surface of the display device 100.

The color filter 460 is disposed under the second substrate 450. Specifically, the color filter 460 is disposed between the second substrate 450 and a sealing member 470. The color filter 460 is to convert white light into light of a specific color, and may be configured of, for example, a red color filter, a green color filter, and a blue color filter. That is, when the sub-pixel SP is a red sub-pixel, the color filter 460 may be a red color filter. Also, when the sub-pixel SP is a green sub-pixel, the color filter 460 may be a green color filter. Also, when the sub-pixel SP is a blue sub-pixel, the color filter 460 may be a blue color filter.

With reference to FIG. 5, the sealing member 470 may be disposed between the first substrate 410 and the second substrate 450. The sealing member 470 may bond the first substrate 410 and the second substrate 450. Also, the sealing member 470 may protect internal components of the transparent display panel 400 from external moisture, air or shock and the like.

With reference to FIG. 5, the transistor 420 and the light emitting element 430 are not disposed in the transmission area TA. That is, the transmission area TA has to be configured to recognize an object visible from the opposite side of the transparent display panel 400. Therefore, in the transmission area TA, light should be transmitted from the first substrate 410 to the second substrate 450 or from the second substrate 450 to the first substrate 410. Accordingly, transparency or translucency of the transmission area TA may be implemented by not disposing the transistor 420 and the light emitting element 430 in the transmission area TA.

The transistor 420, the light emitting element 430, and the color filter 460 are disposed in the emission area EA. That is, the emission area EA may be defined as an area where a driving element such as the transistor 420, the light emitting element 430, and the color filter 460 are disposed. In particular, as illustrated in FIG. 4, the emission area EA may include a plurality of sub-pixels SP.

The transmission area TA and the emission area EA may be formed to have a similar width in the pixel PX. For example, widths of the transmission area TA and the emission area EA in the pixel PX may be formed to have a ratio of 45:55 to 55:45. Accordingly, by slightly moving the second transparent display panel 120 by a distance equal to ½ of a width of the pixel PX, an arrangement structure of the transmission areas TA and the emission areas EA of the first transparent display panel 110 and the second transparent display panel 120 may be easily changed. That is, the first display mode or the second display mode of the display device 100 may be switched by a simple operation. Hereinafter, a switching principle of the first display mode or the second display mode of the display device 100 will be described with reference to FIGS. 6A to 8B.

Figure 6A:
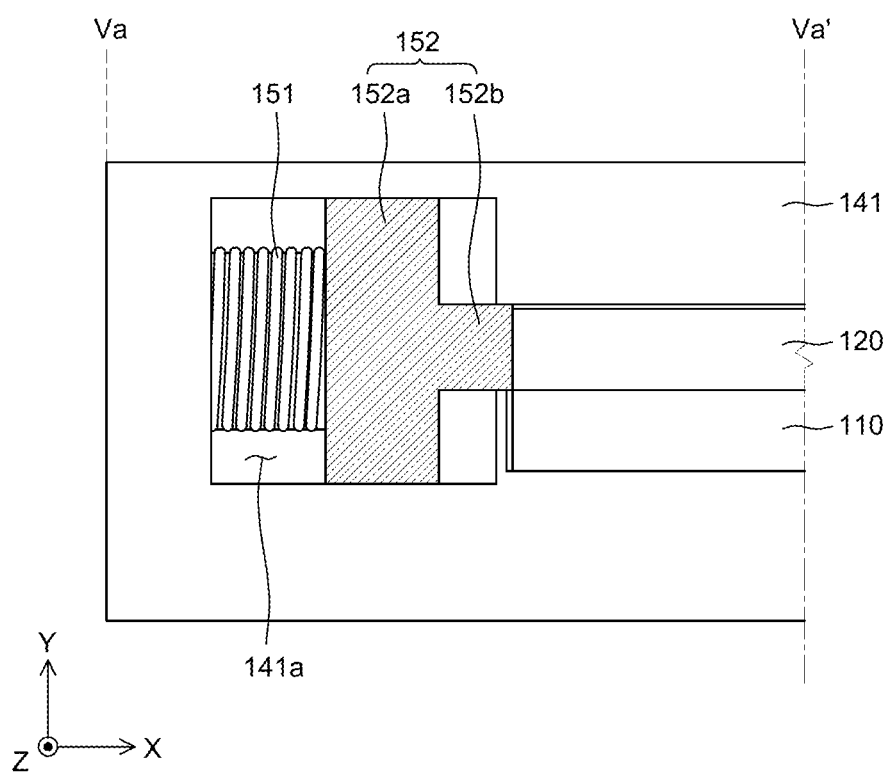
FIG. 6A is a cross-sectional view taken along line Va-Va' of FIG. 2C.
Figure 6B:
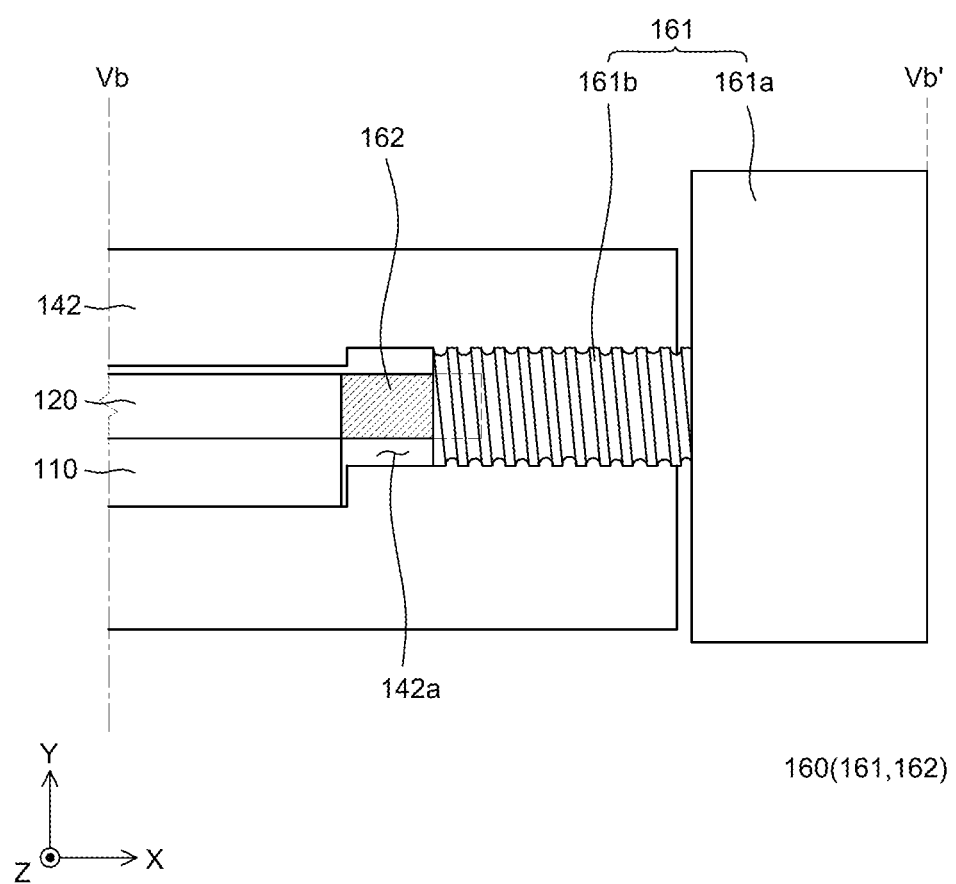
FIG. 6B is a cross-sectional view taken along line Vb-Vb' of FIG. 2C.

FIG. 6A is a cross-sectional view taken along line Va-Va' of FIG. 2C. FIG. 6B is a cross-sectional view taken along line Vb-Vb' of FIG. 2C.

With reference to FIG. 6A, the first case 141 has a shape in which a portion thereof is opened to be combined with the first transparent display panel 110 and the second transparent display panel 120. For example, a right portion of the first case 141 in the first direction (X-axis direction) is opened and may be combined with the first transparent display panel 110 and the second transparent display panel 120. In addition, the first case 141 includes a receiving portion 141a receiving the elastic member 151 and the adjustment liner 152 therein. The receiving portion 141a may be connected to an open area of the first case 141.

One portion of the elastic member 151 may be fixed to an inner surface of the receiving portion 141a of the first case 141. The other portion of the elastic member 151 may be fixed to one surface of the adjustment liner 152. The elastic member 151 may be compressed by the adjustment liner 152 or the second transparent display panel 120 to thereby apply restoring force in a direction of the adjustment liner 152 and the second transparent display panel 120.

The adjustment liner 152 includes a body portion 152a and a protrusion portion 152b. The body portion 152a may be fixed to the elastic member 151. The protrusion portion 152b protrudes from the body portion 152a to be in contact with the second transparent display panel 120. In this case, the protrusion portion 152b may contact the second transparent display panel 120 through a connection area between the receiving portion 141a and the open area of the first case 141. Also, a width of the protrusion portion 152b with respect to the second direction (Y-axis direction) may be equal to or smaller than a width of the second transparent display panel 120 with respect to the second direction. Therefore, the protrusion portion 152b may easily transmit the restoring force of the elastic member 151 only to the second transparent display panel 120.

With reference to FIG. 6B, the second case 142 has a shape in which a portion thereof is opened to be combined with the first transparent display panel 110 and the second transparent display panel 120. For example, a left portion of the second case 142 in the first direction is opened and may be combined with the first transparent display panel 110 and the second transparent display panel 120. In addition, the second case 142 includes a coupling hole 142a coupled to the adjustment member 160. The coupling hole 142a may be connected to an open area of the second case 142.

The adjustment member 160 includes a main adjustment portion 161 and a push liner 162. The main adjustment portion 161 may include a head portion 161a and an insertion portion 161b.

The head portion 161a may be disposed outside the second case 142. Therefore, the adjustment member 160 may be moved to left side and right side in the first direction through the head portion 161a outside the second case 142. For example, the adjustment member 160 may be moved by rotating the head portion 161a. Meanwhile, the head portion 161a may be configured to be rotated by a user or through a separate switch. However, aspects of the present disclosure are not limited thereto.

The insertion portion 161b may extend from the head portion 161a and be coupled to the coupling hole 142a of the second case 142. In this case, an inner surface of the coupling hole 142a may be configured to correspond to an outer surface of the insertion portion 161b. Therefore, the insertion portion 161b is rotated by rotation of the head portion 161a, whereby the main adjustment portion 161 may move in an inner or outer direction of the coupling hole 142a.

The push liner 162 may be fixed to the insertion portion 161b. Specifically, a portion of the push liner 162 may be fixed into the insertion portion 161b, but is not limited thereto. The push liner 162 may contact the second transparent display panel 120. Accordingly, the push liner 162 may be moved by the movement of the main adjustment portion 161, thereby moving the second transparent display panel 120. At this time, a width of the push liner 162 with respect to the second direction may be equal to or smaller than the width of the second transparent display panel 120 with respect to the second direction. Accordingly, the push liner 162 may easily move only the second transparent display panel 120.

Hereinafter, a switching principle of the first display mode or the second display mode of the display device will be described in detail with reference to FIGS. 7A to 8B.

Figure 7A:
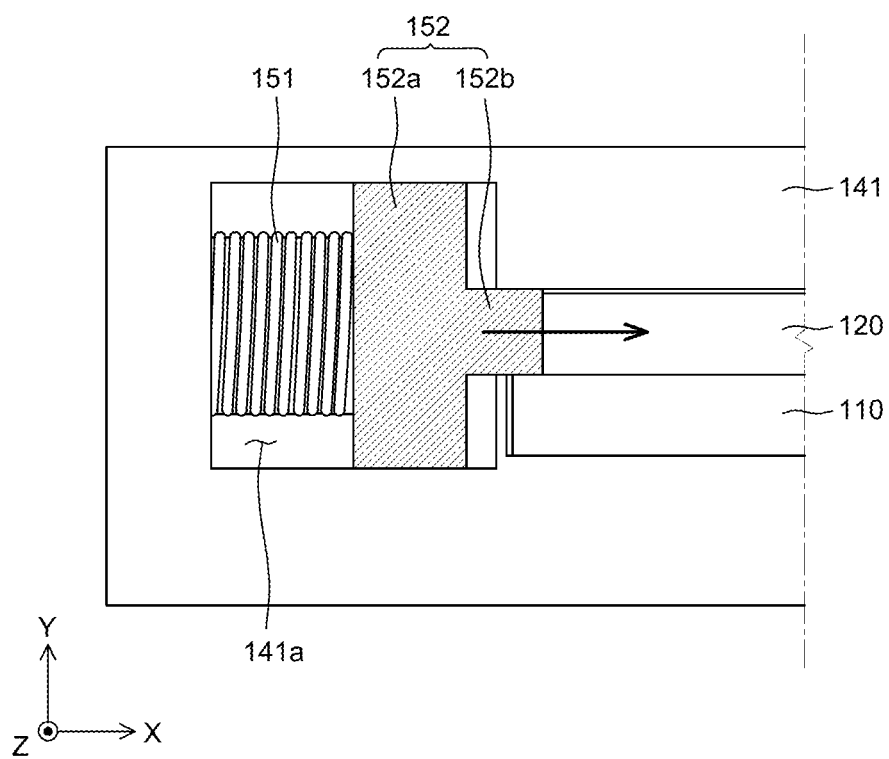
FIGS. 7A and 7B are cross-sectional views for explaining a movement principle of a second transparent display panel of the display device according to an exemplary aspect of the present disclosure.
Figure 7B:
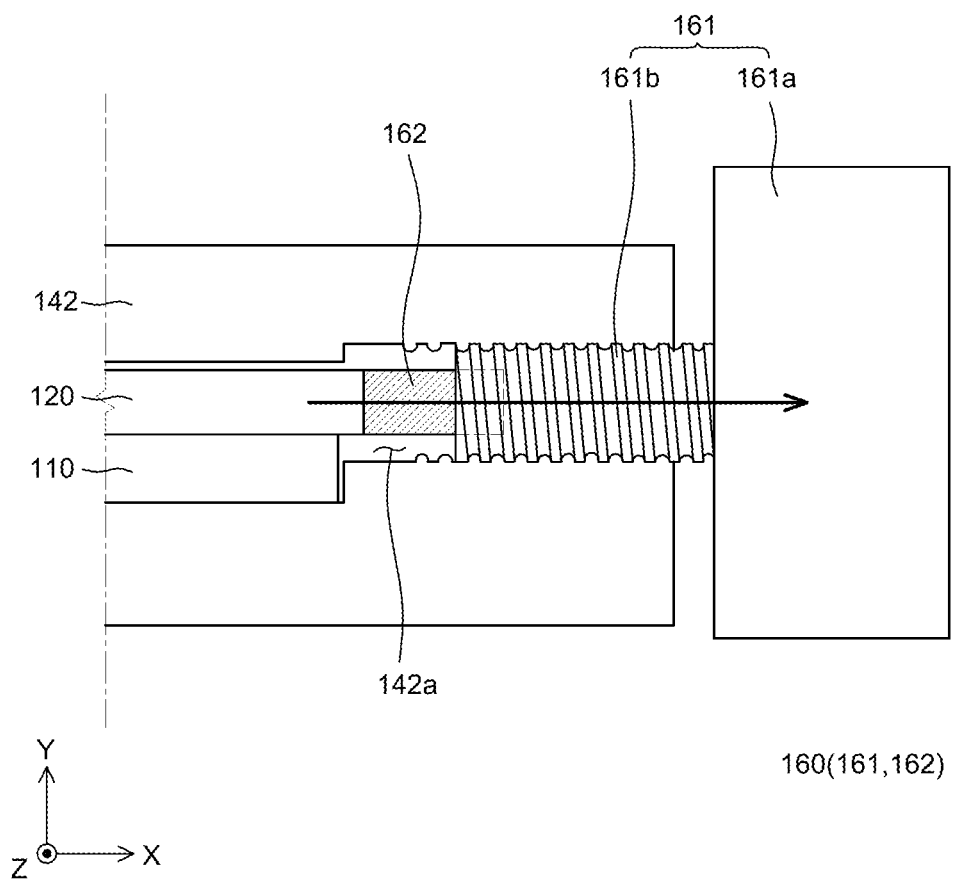
Figure 8A:
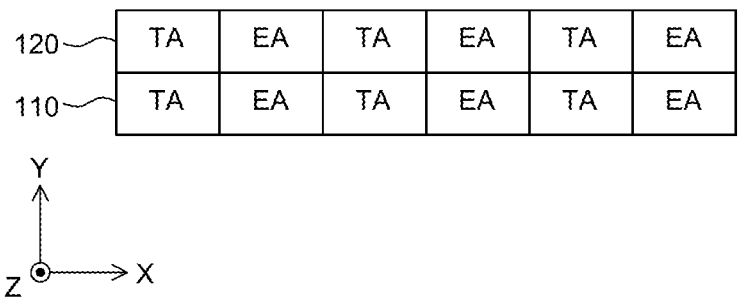
FIGS. 8A and 8B are views for explaining a principle of switching between the first display mode and the second display mode of the display device according to an exemplary aspect of the present disclosure.
Figure 8B:
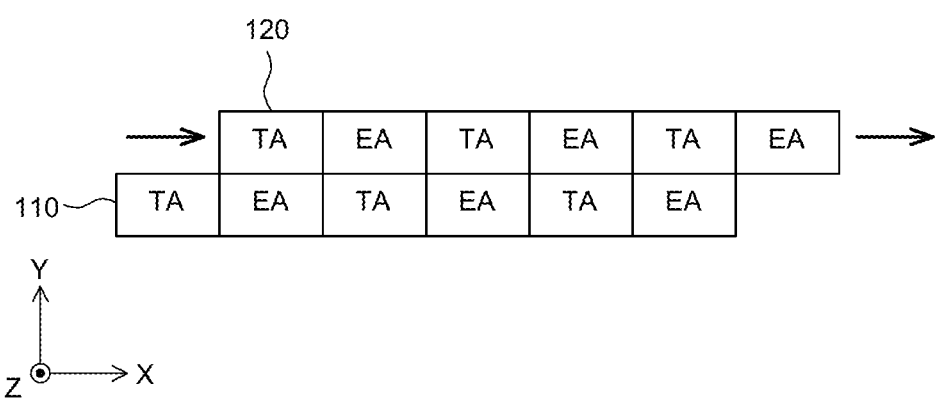

FIGS. 7A and 7B are cross-sectional views for explaining a movement principle of a second transparent display panel of the display device according to an exemplary aspect of the present disclosure. FIGS. 8A and 8B are views for explaining a principle of switching between the first display mode and the second display mode of the display device according to an exemplary aspect of the present disclosure. An arrangement state of the first transparent display panel 110 and the second transparent display panel 120 of FIG. 8A may correspond to those of FIGS. 6A and 6B. An arrangement state of the first transparent display panel 110 and the second transparent display panel 120 of FIG. 8B may correspond to those of FIGS. 7A and 7B. Meanwhile, the transmission area TA and the emission area EA adjacent to each other in FIGS. 8A and 8B may constitute one pixel PX.

With reference to FIGS. 6A, 6B, and 8A, one sides of the first transparent display panel 110 and the second transparent display panel 120 are disposed on the same line, and the other sides of the first transparent display panel 110 and the second transparent display panel 120 are disposed on the same line. In other words, one side surfaces of the first transparent display panel 110 and the second transparent display panel 120 are disposed on the same line in a direction parallel to the second direction, and the other side surfaces of the first transparent display panel 110 and the second transparent display panel 120 are disposed on the same line in the direction parallel to the second direction. In this manner, a state in which one sides of the first transparent display panel 110 and the second transparent display panel 120 are disposed on the same line, and the other sides of the first transparent display panel 110 and the second transparent display panel 120 are disposed on the same line may be defined as a first state.

With reference to FIG. 8A, in the first state, the transmission area TA of the first transparent display panel 110 may overlap the transmission area TA of the second transparent display panel 120. Also, the emission area EA of the first transparent display panel 110 may overlap the emission area EA of the second transparent display panel 120. That is, in the first state, the display device 100 may be in the first display mode in which the image of the emission area EA and the background through the transmission area TA may be simultaneously viewed from the front and rear surfaces. Meanwhile, even if the display device 100 is not driven in the first state, the user may recognize an object disposed on the opposite side of the display device 100 through the transmission area TA.

With reference to FIGS. 7A, 7B, and 8B, one sides of the first transparent display panel 110 and the second transparent display panel 120 are disposed to be offset from each other, and the other sides of the first transparent display panel 110 and the second transparent display panel 120 are disposed to be offset from each other. That is, one sides of the first transparent display panel 110 and the second transparent display panel 120 are not disposed on the same line in the direction parallel to the second direction, and the other sides of the first transparent display panel 110 and the second transparent display panel 120 are not disposed on the same line in the direction parallel to the second direction. Specifically, one side surface of the second transparent display panel 120 is disposed more rightward than one side surface of the first transparent display panel 110, and the other side surface of the second transparent display panel 120 is disposed more rightward than the other side surface of the first transparent display panel 110. In this manner, a state in which one sides of the first transparent display panel 110 and the second transparent display panel 120 are disposed to be offset from each other, and the other sides of the first transparent display panel 110 and the second transparent display panel 120 are disposed to be offset from each other may be defined as a second state.

Specifically, as the main adjustment portion 161 rotates in a direction away from the second transparent display panel 120, the push liner 162, together with the main adjustment portion 161, may move in the direction away from the second transparent display panel 120, as illustrated by an arrow in FIG. 7B. In this case, the second transparent display panel 120 may be in a state in which it receives the restoring force of the elastic member 151 applied by the adjustment liner 152. That is, the restoring force of the elastic member 151 may be applied to the second transparent display panel 120 in a direction from the first case 141 to the second case 142 based on the first direction. Accordingly, as the adjustment member 160 moves in an outer direction of the second case 142, the second transparent display panel 120 may move to right side in the first direction by the restoring force of the elastic member 151, as illustrated by an arrow in FIG. 7A. Thus, one side and the other side of the second transparent display panel 120 may be disposed more rightward in the second direction than one side and the other side of the first transparent display panel 110.

With reference to FIG. 8B, as the second transparent display panel 120 moves to right side in the first direction as illustrated by an arrow, the state of the first transparent display panel 110 and the second transparent display panel 120 may be switched to the second state. In the second state, the transmission area TA of the first transparent display panel 110 may overlap the emission area EA of the second transparent display panel 120. In addition, the emission area EA of the first transparent display panel 110 may overlap the transmission area TA of the second transparent display panel 120. That is, in the second state, the display device 100 may be in the second display mode in which only the image of the emission area EA may be viewed from the front and rear surfaces.

When switching from the second display mode to the first display mode, the adjustment member 160 may move in an inner direction of the second case 142. From this, the second transparent display panel 120, along with the adjustment liner 152, may move to left side in the first direction and compress the elastic member 151. And, the first transparent display panel 110 and the second transparent display panel 120 may be switched back to the first state shown in FIGS. 6A, 6B, and 8A, thereby the display device 100 being switched to the first display mode.

When switching to the first state or the second state, a movement distance of the second transparent display panel 120 may correspond to ½ of the width of the pixel PX with respect to the first direction. In this case, the pixel PX may include the transmission area TA and the emission area EA on the left and the right, respectively, in the first direction. In addition, the widths of the transmission area TA and the emission area EA within the pixel PX with respect to the first direction may be configured to be similar to each other. Therefore, by moving the second transparent display panel 120 by a distance equal to ½ of the width of the pixel PX with respect to the first direction, the first display mode which is a transparent double-sided light emitting mode and the second display mode which is a general double-sided light emitting mode may be switched to each other.

The adjustment member 160 may be configured such that the second transparent display panel 120 may only move by a distance equal to ½ of the width of the pixel PX. Specifically, the main adjustment portion 161 of the adjustment member 160 may move in a rightward direction away from the second transparent display panel 120 or move in a leftward direction toward the second transparent display panel 120. In this case, the movement distance of the second transparent display panel 120 between when the main adjustment portion 161 maximally moves in the rightward direction away from the second transparent display panel 120 and when the main adjustment portion 161 maximally moves in the leftward direction toward the second transparent display panel 120, may be ½ of the width of the pixel PX. That is, the main adjustment portion 161 may be fixed such that the second transparent display panel 120 moves only by a distance equal to ½ of the width of the pixel PX and does not move any more. Accordingly, even if the user directly adjusts the main adjustment portion 161, the second transparent display panel 120 may be prevented from moving by a distance greater than ½ of the width of the pixel PX. Therefore, it is feasible to prevent the second transparent display panel 120 from unnecessarily moving, thereby preventing the switching of the first state or the second state from being performed inaccurately.

For example, when the main adjustment portion 161 is a rotating bolt, when maximally rotating the rotating bolt in the direction away from the second transparent display panel 120 or in the direction toward the second transparent display panel 120, the second transparent display panel 120 may move by a distance equal to ½ of the width of the pixel PX. After the maximal rotation of the rotating bolt, the rotating bolt is no longer rotated, or even if rotated, the second transparent display panel 120 no longer moves and may be stationary. That is, it is unnecessary for the user to arbitrarily calculate the amount of rotation of the rotating bolt so that the second transparent display panel 120 moves only by a distance equal to ½ of the width of the pixel PX. Therefore, the user may easily switch the mode of the display device to the first display mode or the second display mode, and accuracy at the time of switching may be improved.

When the second transparent display panel 120 moves by a distance equal to ¼ of the width of the pixel PX, the transmission area TA of any one of the first transparent display panel 110 and the second transparent display panel 120 may simultaneously overlap the transmission area TA and the emission area EA of the other panel. In this case, since an area of a region where the transmission areas TA of the first transparent display panel 110 and the second transparent display panel 120 overlap each other in the first display mode is reduced, transparency may be degraded.

Meanwhile, ½ of the width of the pixel PX may be 0.3 mm to 0.5 mm. However, aspects of the present disclosure are not limited thereto.

With reference to FIGS. 8A and 8B, positions of the transmission area TA and the emission area EA of the first transparent display panel 110 when viewed from the front of the first transparent display panel 110 may be different from those of the transmission area TA and the emission area EA of the second transparent display panel 120 when viewed from the front of the second transparent display panel 120. That is, when viewed from the front of the first transparent display panel 110, the transmission area TA may be disposed on the left of the first transparent display panel 110 and the emission area EA may be disposed on the right of the first transparent display panel 110. Meanwhile, when viewed from the front of the second transparent display panel 120, the emission area EA may be disposed on the left of the second transparent display panel 120 and the transmission area TA may be disposed on the right of the second transparent display panel 120.

Meanwhile, in an exemplary aspect of the present disclosure, states of FIGS. 6A, 6B, and 8A are defined as the first state, and states of FIGS. 7A, 7B, and 8B are defined as the second state. However, the states of FIGS. 7A, 7B, and 8B may be defined as the first state, and the states of FIGS. 6A, 6B, and 8A may be defined as the second state.

In addition, in an exemplary aspect of the present disclosure, it is described that when switching from the first state to the second state, the second transparent display panel 120 moves to right side in the first direction, but is not limited thereto. That is, when switching from the first state to the second state, the second transparent display panel 120 may move to left side in the first direction. In this case, in the second state, one side of the second transparent display panel 120 is disposed more leftward than one side of the first transparent display panel 110, and the other side of the second transparent display panel 120 is disposed more leftward than the other side of the first transparent display panel 110.

In addition, in an exemplary aspect of the present disclosure, it is described that the second transparent display panel 120 moves when the first state or the second state is switched, but is not limited thereto. That is, the first state or the second state may be switched by moving the first transparent display panel 110, instead of the second transparent display panel 120.

A general transparent display device includes a transmission area and an emission area in one pixel. Accordingly, it is feasible to recognize a background located in the rear of the transparent display device through the transmission area, and to view an image through the emission area. However, the image may be viewed and the background may be recognized only on the front surface of the transparent display device, and it is unfeasible to view the image on the rear surface of the transparent display device.

The display device 100 according to an exemplary aspect of the present disclosure includes the first transparent display panel 110 and the second transparent display panel 120, so that an image may be viewed and a background may be recognized on both the front and rear surfaces. In this case, the first transparent display panel 110 and the second transparent display panel 120 may be disposed such that the transmission areas TA thereof overlap each other and the emission areas EA thereof overlap each other. Accordingly, the display device 100 may be driven in the first display mode which is a transparent double-sided light emitting mode.

In addition, the display device 100 may be formed such that only an image is viewed from the front and rear surfaces. In this case, the transmission area TA of one panel of the first transparent display panel 110 and the second transparent display panel 120 may be disposed to overlap the emission area EA of the other panel. Therefore, the display device 100 may be driven in the second display mode, which is a general double-sided light emitting mode.

That is, the display device 100 according to an exemplary aspect of the present disclosure may perform a transparent double-sided light emission and a general double-sided light emission. Accordingly, user convenience may be improved by switching the display device 100 from a transparent double-sided light emission type to a general double-sided light emission type, according to a situation.

The switching to the first display mode or the second display mode may be simply performed by moving the second transparent display panel 120 by only a distance equal to ½ of the width of the pixel. Specifically, the second transparent display panel 120 is moved to left side or right side by the movement of the adjustment member 160 and the elastic restoring force of the elastic member 151, whereby switching to the first display mode or the second display mode may be performed. That is, the switching of the mode of the display device 100 may be performed by a simple structure and operation.

Figure 9A:
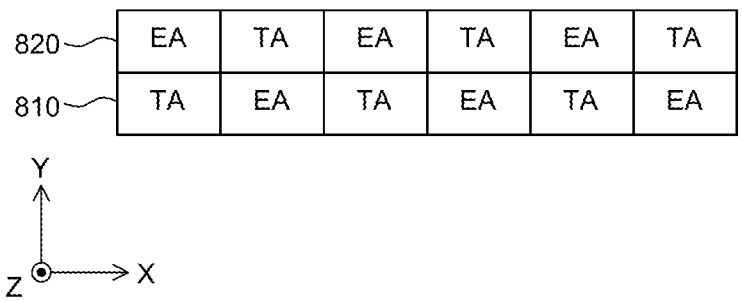
FIGS. 9A and 9B are views for explaining a principle of switching between a first display mode and a second display mode of a display device according to another exemplary aspect of the present disclosure.
Figure 9B:
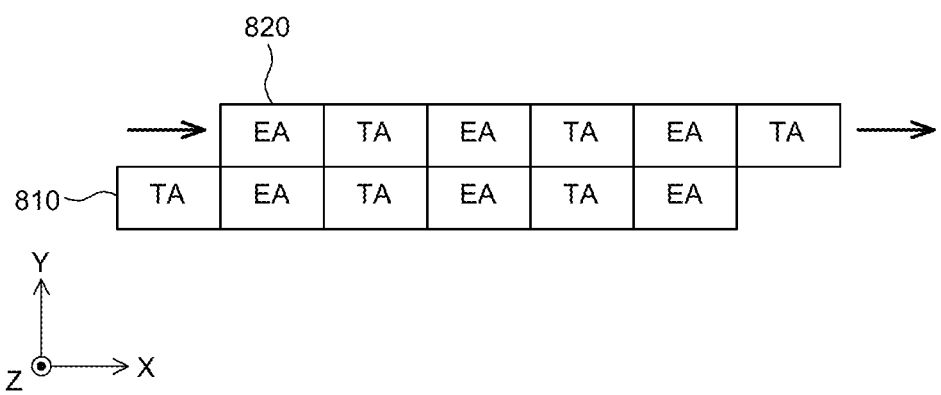

FIGS. 9A and 9B are views for explaining a principle of switching between a first display mode and a second display mode of a display device according to another exemplary aspect of the present disclosure. The display device of FIGS. 9A and 9B is substantially the same as the display device 100 of FIGS. 1 to 8B, except for a structure of the pixel PX. Therefore, a redundant description will be omitted. An arrangement relationship between transparent display panels 810 and 820 of FIG. 9A may correspond to that of FIGS. 6A and 6B. An arrangement relationship between the transparent display panels 810 and 820 of FIG. 9B may correspond to that of FIGS. 7A and 7B.

With reference to FIGS. 9A and 9B, positions of the transmission area TA and the emission area EA of the first transparent display panel 810 when viewed from the front of the first transparent display panel 810 may be the same as those of the transmission area TA and the emission area EA of the second transparent display panel 820 when viewed from the front of the second transparent display panel 820. That is, when viewed from the front of the first transparent display panel 810, the transmission area TA may be disposed on the left of the first transparent display panel 810 and the emission area EA may be disposed on the right of the first transparent display panel 810. In addition, when viewed from the front of the second transparent display panel 820, the transmission area TA may be disposed on the left of the second transparent display panel 820 and the emission area EA may be disposed on the right of the second transparent display panel 820.

With reference to FIG. 9A, one sides of the first transparent display panel 810 and the second transparent display panel 820 are disposed on the same line, and the other sides of the first transparent display panel 810 and the second transparent display panel 820 are disposed on the same line. In other words, one side surfaces of the first transparent display panel 810 and the second transparent display panel 820 are disposed on the same line in a direction parallel to the second direction, and the other side surfaces of the first transparent display panel 810 and the second transparent display panel 820 are disposed on the same line in the direction parallel to the second direction. In this manner, a state in which one sides of the first transparent display panel 810 and the second transparent display panel 820 are disposed on the same line, and the other sides of the first transparent display panel 810 and the second transparent display panel 820 are disposed on the same line may be defined as a first state.

In the first state, the transmission area TA of the first transparent display panel 810 may overlap the emission area EA of the second transparent display panel 820. Also, the emission area EA of the first transparent display panel 810 may overlap the transmission area TA of the second transparent display panel 820. That is, in the first state, the display device may be in the second display mode in which only the image of the emission area EA may be viewed from the front and rear surfaces.

With reference to FIG. 9B, one sides of the first transparent display panel 810 and the second transparent display panel 820 are disposed to be offset from each other, and the other sides of the first transparent display panel 810 and the second transparent display panel 820 are disposed to be offset from each other. In other words, one sides of the first transparent display panel 810 and the second transparent display panel 820 are not disposed on the same line in the direction parallel to the second direction, and the other sides of the first transparent display panel 810 and the second transparent display panel 820 are not disposed on the same line in the direction parallel to the second direction. Specifically, one side surface of the second transparent display panel 820 is disposed more rightward than one side surface of the first transparent display panel 810, and the other side surface of the second transparent display panel 820 is disposed more rightward than the other side surface of the first transparent display panel 810. In this manner, a state in which one sides of the first transparent display panel 810 and the second transparent display panel 820 are disposed to be offset from each other, and the other sides of the first transparent display panel 810 and the second transparent display panel 820 are disposed to be offset from each other may be defined as a second state.

In the second state, the transmission area TA of the first transparent display panel 810 may overlap the transmission area TA of the second transparent display panel 820. Also, the emission area EA of the first transparent display panel 810 may overlap the emission area EA of the second transparent display panel 820. That is, in the second state, the display device may be in the first display mode in which the image of the emission area EA and the background through the transmission area TA may be simultaneously viewed from the front and rear surfaces.

Meanwhile, the switching from the first state to the second state may be performed in the same manner as that in FIGS. 6A to 7B described above. That is, the switching from the first state to the second state may be feasible through an operation of the adjustment member 160 in the first state. Specifically, as the adjustment member 160 moves in the outer direction of the second case 142, the second transparent display panel 820 may move to right side in the first direction (X-axis direction) by the restoring force of the elastic member 151. That is, when switching from the first state to the second state, the second transparent display panel 820 may move to right side in the first direction, as illustrated by an arrow in FIG. 9B. Thus, one side and the other side of the second transparent display panel 820 may be disposed more rightward than one side and the other side of the first transparent display panel 810, in the second direction. From this, the display device may be switched from the second display mode to the first display mode.

In addition, it is feasible to switch back the second state to the first state through the operation of the adjustment member 160. Specifically, as the adjustment member 160 moves in the inner direction of the second case 142, the second transparent display panel 820 and the adjustment liner 152 may move to left side in the first direction, while pressing the elastic member 151. From this, the display device may be switched from the first display mode to the second display mode.

Meanwhile, in another exemplary aspect of the present disclosure, the state of FIG. 9A is defined as the first state, and the state of FIG. 9B is defined as the second state. However, the state of FIG. 9B may be defined as the first state, and the state of FIG. 9A may be defined as the second state.

In addition, in another exemplary aspect of the present disclosure, it is described that when switching from the first state to the second state, the second transparent display panel 820 moves to right side in the first direction, but is not limited thereto. That is, when switching from the first state to the second state, the second transparent display panel 820 may move to left side in the first direction. In this case, in the second state, one side of the second transparent display panel 820 is disposed more leftward than one side of the first transparent display panel 810, and the other side of the second transparent display panel 820 is disposed more leftward than the other side of the first transparent display panel 810.

In addition, in another exemplary aspect of the present disclosure, it is described that the second transparent display panel 820 moves when the first state or the second state is switched, but is not limited thereto. That is, the first state or the second state may be switched by moving the first transparent display panel 810, instead of the second transparent display panel 820.

In the display device according to another exemplary aspect of the present disclosure, the first transparent display panel 810 and the second transparent display panel 820 may have the same structure. That is, each pixel PX of the first transparent display panel 810 and the second transparent display panel 820 may be formed such that the transmission area TA is disposed leftward and the emission area EA is disposed rightward, in the first direction. Therefore, since the display device may be configured with the same transparent display panels, a manufacturing process of the display device may be further simplified.

Figure 10:
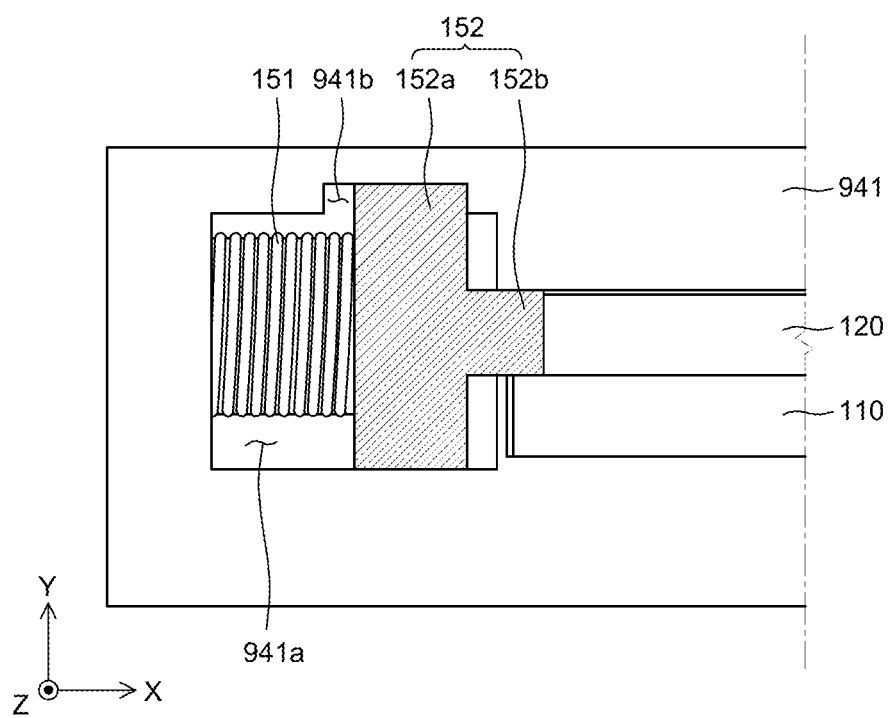
FIG. 10 is a cross-sectional view of a display device according to still another exemplary aspect of the present disclosure.

FIG. 10 is a cross-sectional view of a display device according to still another exemplary aspect of the present disclosure. The display device of FIG. 10 is substantially the same as the display device 100 of FIGS. 1 to 8B, except for a structure of a first case 941. Therefore, a redundant description will be omitted.

With reference to FIG. 10, the first case 941 has a shape in which a portion thereof is opened to be combined with the first transparent display panel 110 and the second transparent display panel 120. For example, a right portion of the first case 941 in the first direction (X-axis direction) is opened and may be combined with the first transparent display panel 110 and the second transparent display panel 120. In addition, the first case 941 includes a receiving portion 941a receiving the elastic member 151 and the adjustment liner 152 therein. The receiving portion 941a may be connected to an open area of the first case 941.

In particular, the first case 941 may include a fixing groove 941b extending from the receiving portion 941a. Here, a portion of the body portion 152a of the adjustment liner 152 may be inserted into the fixing groove 941b.

In the first direction (X-axis direction), a width of the fixing groove 941b may be smaller than a width of the receiving portion 941a. In addition, in the first direction, the width of the fixing groove 941b may correspond to the sum of a width of the body portion 152a and ½ of the width of the pixel PX. At this time, since the body portion 152a is inserted into the fixing groove 941b, a space corresponding to ½ of the width of the pixel PX may exist in the fixing groove 941b. Therefore, the body portion 152a may move to left side or right side by a distance equal to ½ of the width of the pixel PX, within the fixing groove 941b.

In the display device according to another exemplary aspect of the present disclosure, the fixing groove 941b into which a portion of the body portion 152a is inserted may be formed in the first case 941. In this case, the fixing groove 941b may have a width that allows the body portion 152a to move by a distance equal to ½ of the width of the pixel in the first direction. Therefore, since the body portion 152a moves to left side or right side only by a distance equal to ½ of the width of the pixel PX, the switching to the first display mode which is in the first state or the second display mode which is in the second state may be further accurately performed.

In addition, an initial alignment of the first transparent display panel 110 and the second transparent display panel 120 may be accurately performed through the fixing groove 941b. That is, the fixing groove 941b is formed such that the second transparent display panel 120 can move only in the first state or the second state, whereby the first transparent display panel 110 and the second transparent display panel 120 may be easily aligned. In addition, an excessive movement of the second transparent display panel 120 is prevented by the fixing groove 941b, thereby improving reliability of the display device.

Figure 11A:
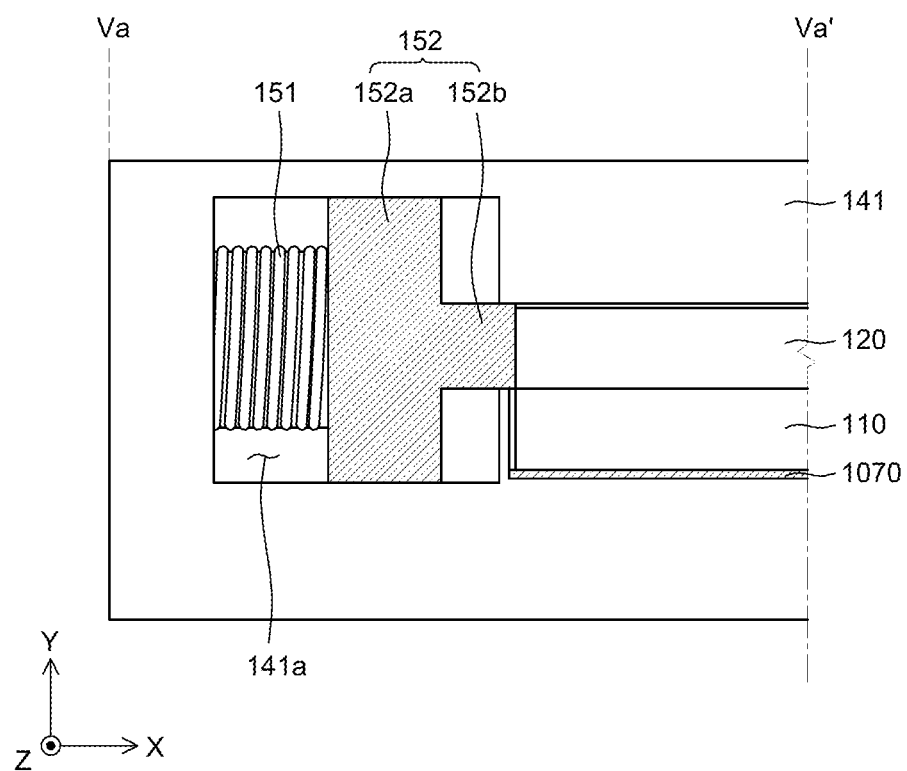
FIGS. 11A and 11B are cross-sectional views of a display device according to still another exemplary aspect of the present disclosure.
Figure 11B:
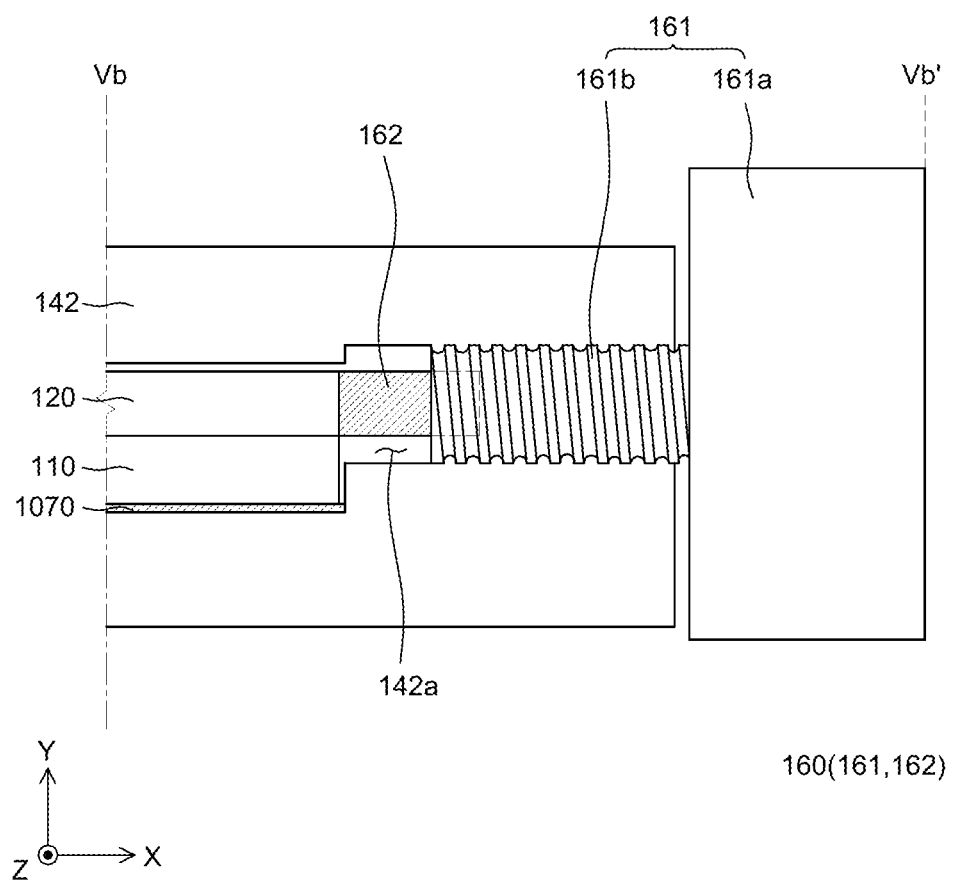

FIGS. 11A and 11B are cross-sectional views of a display device according to still another exemplary aspect of the present disclosure. The display device of FIGS. 11A and 11B is substantially the same as the display device 100 of FIGS. 1 to 8B except for a fixing member 1070, and thus, a redundant description will be omitted.

With reference to FIGS. 11A and 11B, each of the first case 141 and the second case 142 include an open area with which the first transparent display panel 110 and the second transparent display panel 120 are combined. In this case, the fixing member 1070 may be disposed between the open area of the first case 141 and the first transparent display panel 110 and between the open area of the second case 142 and the first transparent display panel 110. The fixing member 1070 may prevent the movement of the first transparent display panel 110 when the second transparent display panel 120 moves to left side or right side.

The fixing member 1070 may be formed of a double-sided adhesive or adhesive tape, but is not limited thereto. In FIGS. 11A and 11B, the fixing member 1070 is illustrated as being disposed inside the first case 141 and the second case 142, but in some cases, one of the two fixing members may be omitted.

The display device according to another exemplary aspect of the present disclosure may include the fixing member 1070 configured to fix the first transparent display panel 110 to the first case 141 or the second case 142. Therefore, when the second transparent display panel 120 moves to left side or right side, the movement of the first transparent display panel 110, along with the movement of the second transparent display panel 120, may be prevented. That is, by fixing the first transparent display panel 110 to the first case 141 or the second case 142, the switching of the first display mode or the second display mode according to the movement of the second transparent display panel 120 may be further accurately performed.

The exemplary aspects of the present disclosure can also be described as follows:

According to an aspect of the present disclosure, there is provided a display device. The display device includes a first transparent display panel including a plurality of pixels. The display device further includes a second transparent display panel overlapping the first transparent display panel and including a plurality of pixels. The display device further includes an elastic member pressing one side of the second transparent display panel. The display device further includes an adjustment member disposed on the other side of the second transparent display panel and moving the second transparent display panel leftward or rightward.

Each of the plurality of pixels of the first transparent display panel and the plurality of pixels of the second transparent display panel may include a transmission area and an emission area, the transmission area may be disposed leftward within the pixel in a first direction in which the second transparent display panel moves, and the emission area may be disposed rightward within the pixel in the first direction in which the second transparent display panel moves.

The second transparent display panel may be moved by the adjustment member to thereby the display device be switched to a first state or a second state, the first state may be a state in which one sides of the first transparent display panel and the second transparent display panel are disposed on the same line, and the other sides of the first transparent display panel and the second transparent display panel are disposed on the same line, and the second state may be a state in which the one sides of the first transparent display panel and the second transparent display panel are disposed to be offset from each other, and the other sides of the first transparent display panel and the second transparent display panel are disposed to be offset from each other.

A movement distance of the second transparent display panel when the display device switched to the first state or the second state may be ½ of a width of the pixel with respect to the first direction.

When the transmission area of the first transparent display panel and the transmission area of the second transparent display panel overlap each other in the first state, the transmission area of the first transparent display panel and the emission area of the second transparent display panel overlap each other in the second state.

When the transmission area of the first transparent display panel and the emission area of the second transparent display panel may overlap each other in the first state, the transmission area of the first transparent display panel and the transmission area of the second transparent display panel overlap each other in the second state.

The display device may further include a first case and a second case surrounding one sides and the other sides of the first transparent display panel and the second transparent display panel, respectively, the elastic member may be disposed within the first case, and the adjustment member may be coupled to the second case.

The display device may further include an adjustment liner disposed between the elastic member and the second transparent display panel, the adjustment liner may include a body portion contacting the elastic member and a protrusion portion protruding from the body portion and contacting the one side of the second transparent display panel.

At least one of the elastic member, the adjustment liner, and the adjustment member may be provided in plural.

A portion of the body portion may be inserted into a fixing groove within the first case, the fixing groove may have a width allowing the body portion to move by a distance equal to ½ of a width of the pixel.

The display device may further include a fixing member configured to fix the first transparent display panel to the first case or the second case.

The adjustment member may include a main adjustment portion moving in a direction away from the second transparent display panel or in a direction toward the second transparent display panel to thereby control a movement of the second transparent display panel and a push liner disposed between the main adjustment portion and the second transparent display panel.

A movement distance of the second transparent display panel between when the main adjustment portion maximally moves in the direction away from the second transparent display panel and when the main adjustment portion maximally moves in the direction toward the second transparent display panel, may be ½ of a width of the pixel.

According to another aspect of the present disclosure, there is provided a display device. The display device includes a first transparent display panel including a plurality of pixels. The display device further includes a second transparent display panel overlapping the first transparent display panel and including a plurality of pixels. The display device further includes an elastic member pressing one side of the second transparent display panel. The display device further includes an adjustment member disposed on the other side of the second transparent display panel and moving the second transparent display panel leftward or rightward. The display device further includes a first case and a second case surrounding one sides and the other sides of the first transparent display panel and the second transparent display panel, respectively. Each of the plurality of pixels of the first transparent display panel and the plurality of pixels of the second transparent display panel includes a transmission area and an emission area, the transmission area being disposed leftward and the emission area being disposed rightward in a first direction in which the second transparent display panel moves. By the movement of the second transparent display panel, the transmission area of the first transparent display panel overlaps the transmission area or the emission area of the second transparent display panel.

The elastic member may be disposed within the first case, and the adjustment member may be coupled to the second case.

The display device may further include an adjustment liner disposed between the elastic member and the second transparent display panel, the adjustment liner may include a body portion contacting the elastic member and a protrusion portion protruding from the body portion and contacting the one side of the second transparent display panel.

A portion of the body portion may be inserted into a fixing groove within the first case, the fixing groove may have a width allowing the body portion to move by a distance equal to ½ of a width of the pixel.

The adjustment member may include a main adjustment portion moving in a direction away from the second transparent display panel or in a direction toward the second transparent display panel to thereby control the movement of the second transparent display panel and a push liner disposed between the main adjustment portion and the second transparent display panel.

A movement distance of the second transparent display panel between when the main adjustment portion maximally moves in the direction away from the second transparent display panel and when the main adjustment portion maximally moves in the direction toward the second transparent display panel, may be ½ of a width of the pixel.

The second transparent display panel may be moved by the adjustment member to thereby the display device be switched to a first state or a second state, the first state is a state in which one sides of the first transparent display panel and the second transparent display panel are disposed on the same line, and the other sides of the first transparent display panel and the second transparent display panel are disposed on the same line, the second state is a state in which the one sides of the first transparent display panel and the second transparent display panel are disposed to be offset from each other, and the other sides of the first transparent display panel and the second transparent display panel are disposed to be offset from each other, and a movement distance of the second transparent display panel when the display device switched to the first state or the second state is ½ of a width of the pixel with respect to the first direction.

When the transmission area of the first transparent display panel and the transmission area of the second transparent display panel may overlap each other in the first state, the transmission area of the first transparent display panel and the emission area of the second transparent display panel overlap each other in the second state, and when the transmission area of the first transparent display panel and the emission area of the second transparent display panel may overlap each other in the first state, the transmission area of the first transparent display panel and the transmission area of the second transparent display panel overlap each other in the second state.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a first transparent display panel including a plurality of first pixels;
   a second transparent display panel overlapping with the first transparent display panel and including a plurality of second pixels;
   an elastic member pressing a first side of the second transparent display panel; and
   an adjustment member at a second side of the second transparent display panel and moving the second transparent display panel to a left side or a right side,
   wherein each of the plurality of first pixels and each of the plurality of second pixels includes a transmission area and an emission area,
   wherein the transmission area and the emission area are alternately and continuously disposed in a first direction on the first transparent display panel and the second transparent display panel,
   wherein the first direction is a direction in which the second transparent display panel moves,
   wherein the second transparent display panel is moved by the adjustment member to switch the display device between a first state and a second state,
   wherein the first state is a state in which one sides of the first transparent display panel and the second transparent display panel are disposed on the same line, and the other sides of the first transparent display panel and the second transparent display panel are disposed on the same line, and
   wherein the second state is a state in which the one sides of the first transparent display panel and the second transparent display panel are disposed to be offset from each other, and the other sides of the first transparent display panel and the second transparent display panel are disposed to be offset from each other.

2. The display device of claim 1,
   wherein the transmission area is disposed on the left side within the plurality of first and second pixels in the first direction, and
   wherein the emission area is disposed on the right side within the plurality of first and second pixels in the first direction.

3. The display device of claim 1, wherein a movement distance of the second transparent display panel when the display device is switched between the first state and the second state is ½ of a width of the plurality of first and second pixels with respect to the first direction.

4. The display device of claim 1, wherein, when the transmission area of the first transparent display panel and the transmission area of the second transparent display panel overlap with each other in the first state, the transmission area of the first transparent display panel and the emission area of the second transparent display panel overlap with each other in the second state.

5. The display device of claim 1, when the transmission area of the first transparent display panel and the emission area of the second transparent display panel overlap with each other in the first state, the transmission area of the first transparent display panel and the transmission area of the second transparent display panel overlap with each other in the second state.

6. The display device of claim 1, further comprising first and second cases surrounding the first and second sides of the first and second transparent displays, respectively, and
   wherein the elastic member is disposed within the first case, and the adjustment member is coupled to the second case.

7. The display device of claim 6, further comprising an adjustment liner disposed between the elastic member and the second transparent display panel,
   wherein the adjustment liner includes a body portion contacting the elastic member and a protrusion portion protruding from the body portion and contacting the first side of the second transparent display panel.

8. The display device of claim 7, wherein at least one of the elastic member, the adjustment liner, and the adjustment member is provided in plural.

9. The display device of claim 7, wherein a portion of the body portion is inserted into a fixing groove within the first case, and
   wherein the fixing groove has a width allowing the body portion to move by a distance equal to ½ of a width of the pixel.

10. The display device of claim 6, further comprising a fixing member configured to fix the first transparent display panel to the first case or the second case.

11. The display device of claim 1, wherein the adjustment member includes,
- a main adjustment portion moving in a direction away from the second transparent display panel or in a direction toward the second transparent display panel to control a movement of the second transparent display panel; and
- a push liner disposed between the main adjustment portion and the second transparent display panel.

12. The display device of claim 11, wherein a movement distance of the second transparent display panel between when the main adjustment portion maximally moves in the direction away from the second transparent display panel and when the main adjustment portion maximally moves in the direction toward the second transparent display panel, is ½ of a width of the pixel.

13. A display device, comprising:
- a first transparent display panel including a plurality of pixels;
- a second transparent display panel overlapping with the first transparent display panel and including a plurality of pixels;
- an elastic member pressing a first side of the second transparent display panel;
- an adjustment member at a second side of the second transparent display panel and moving the second transparent display panel to a left side or a right side; and
- a first case and a second case surrounding the first and second sides of the first transparent display panel and the second transparent display panel, respectively,
- wherein each of the plurality of pixels of the first transparent display panel and the plurality of pixels of the second transparent display panel includes a transmission area and an emission area, the transmission area being disposed on the left side and the emission area being disposed on the right side in a first direction in which the second transparent display panel moves,
- wherein the transmission area and the emission area are alternately and continuously disposed in the first direction on the first transparent display panel and the second transparent display panel,
- wherein, by the movement of the second transparent display panel, the transmission area of the first transparent display panel overlaps with the transmission area or the emission area of the second transparent display panel,
- wherein the second transparent display panel is moved by the adjustment member to thereby the display device be switched to a first state or a second state,
- wherein the first state is a state in which the first sides of the first transparent display panel and the second transparent display panel are disposed on the same line, and the second sides of the first transparent display panel and the second transparent display panel are disposed on the same line, and
- wherein the second state is a state in which the first sides of the first transparent display panel and the second transparent display panel are disposed to be offset from each other, and the second sides of the first transparent display panel and the second transparent display panel are disposed to be offset from each other.

14. The display device of claim 13, wherein the elastic member is disposed within the first case, and the adjustment member is coupled to the second case.

15. The display device of claim 13, further comprising an adjustment liner disposed between the elastic member and the second transparent display panel,
- wherein the adjustment liner includes a body portion contacting the elastic member and a protrusion portion protruding from the body portion and contacting the first side of the second transparent display panel.

16. The display device of claim 15, wherein a portion of the body portion is inserted into a fixing groove within the first case, and
- wherein the fixing groove has a width allowing the body portion to move by a distance equal to ½ of a width of the pixel.

17. The display device of claim 13, wherein the adjustment member includes,
- a main adjustment portion moving in a direction away from the second transparent display panel or in a direction toward the second transparent display panel to control the movement of the second transparent display panel; and
- a push liner disposed between the main adjustment portion and the second transparent display panel.

18. The display device of claim 17, wherein a movement distance of the second transparent display panel between when the main adjustment portion maximally moves in the direction away from the second transparent display panel and when the main adjustment portion maximally moves in the direction toward the second transparent display panel, is ½ of a width of the pixel.

19. The display device of claim 13,
- wherein a movement distance of the second transparent display panel when the display device is switched between the first state and the second state is ½ of a width of the pixel with respect to the first direction.

20. The display device of claim 19, wherein, when the transmission area of the first transparent display panel and the transmission area of the second transparent display panel overlap each other in the first state, the transmission area of the first transparent display panel and the emission area of the second transparent display panel overlap with each other in the second state, and
- wherein, when the transmission area of the first transparent display panel and the emission area of the second transparent display panel overlap each other in the first state, the transmission area of the first transparent display panel and the transmission area of the second transparent display panel overlap with each other in the second state.

21. The display device of claim 13, wherein each of the first transparent display panel and the second transparent display panel includes a first substrate, a transistor, a light emitting element, a second substrate and a color filter, and
- wherein the second substrate of the first transparent display panel corresponds to a front surface of the display device, and the second substrate of the second transparent display panel corresponds to a rear surface of the display device.

* * * * *